(12) United States Patent
Okada et al.

(10) Patent No.: US 7,956,433 B2
(45) Date of Patent: Jun. 7, 2011

(54) IMAGE DETECTOR AND RADIATION DETECTING SYSTEM WITH SEPARATION OF METAL LAYERS FOR BIAS, SCAN AND DATA LINES

(75) Inventors: Yoshihiro Okada, Kanagawa (JP); Takuya Yoshimi, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 11/961,558

(22) Filed: Dec. 20, 2007

(65) Prior Publication Data
US 2008/0210946 A1 Sep. 4, 2008

(30) Foreign Application Priority Data

Dec. 20, 2006 (JP) ................. 2006-342754
Dec. 17, 2007 (JP) ................. 2007-324263

(51) Int. Cl.
*H01L 31/00* (2006.01)
(52) U.S. Cl. ............... 257/440; 257/114; 257/E27.13
(58) Field of Classification Search ............ 257/72, 257/114, 234, 440, E31.041, E29.117, E27.131, 257/E27.152, E21.656
See application file for complete search history.

(56) References Cited

U.S. PATENT DOCUMENTS

| 6,323,490 B1 | 11/2001 | Ikeda et al. |
| 2002/0076861 A1 | 6/2002 | Kwon |
| 2005/0018097 A1 | 1/2005 | Kwon et al. |
| 2006/0065842 A1* | 3/2006 | Okamura et al. ........ 250/370.09 |

FOREIGN PATENT DOCUMENTS

| EP | 1 120 833 A2 | 8/2001 |
| JP | 11-190774 A | 7/1999 |
| JP | 2001-135809 A | 5/2001 |
| JP | 2005-274257 A | 10/2005 |
| WO | 2004/073067 A1 | 8/2004 |

OTHER PUBLICATIONS

EP Communication, dated Feb. 16, 2011, issued in corresponding EP Application No. 07024643.4, 12 pages.

* cited by examiner

*Primary Examiner* — A. Sefer
*Assistant Examiner* — Dilinh P Nguyen
(74) *Attorney, Agent, or Firm* — Sughrue Mion, PLLC

(57) ABSTRACT

The invention provides an image detector capable of improving the quality of detected images by reducing electronic noise, the image detector comprising, a plurality of scan lines disposed in parallel, a plurality of data lines provided so as to cross with the scan lines, thin film transistors connected with the scan and data lines and provided in matrix, sensor sections connected to the thin film transistor and provided in a matrix and a plurality of common lines disposed so as to apply bias voltage commonly to the sensor sections provided in matrix. Each of the scan lines, data lines and common lines are formed by metal layers different from each other and provided with insulating film(s) disposed therebetween.

14 Claims, 23 Drawing Sheets

PRIOR ART

PRIOR ART

IMAGE DETECTOR AND RADIATION DETECTING SYSTEM WITH SEPARATION OF METAL LAYERS FOR BIAS, SCAN AND DATA LINES

CROSS-REFERENCE TO RELATED APPLICATION

This application claims priority under 35 USC 119 from Japanese Patent Application No. 2006-342754 and 2007-324263, the disclosure of which is incorporated by reference herein.

BACKGROUND OF THE INVENTION

1. Field of the Invention

The present invention relates to an image detector in which a large number of pixels having a thin film transistor is two-dimensionally arrayed and specifically relates to a structure of the pixel thereof.

2. Description of the Related Art

A FPD (Flat Panel Detector) in which an X-ray sensitive layer is disposed on a TFT active matrix substrate and is capable of converting X-ray information directly into digital data, has been put into practice lately. The FPD has merit that enables one to instantly confirm images and even video images as compared to a prior art imaging plate. Therefore, it is spreading rapidly.

At first, radiation image detector using the FPD will be explained with reference to FIG. 20.

The radiation image detector has been constructed by forming a semiconductor film 6, having electromagnetic wave conductivity on an active matrix substrate 10 in which charge collecting electrodes 11 are disposed in array, and by forming a bias electrode 7 on the semiconductor film 6. Further, the upper electrode 7 is connected to a high voltage source.

The semiconductor film 6 is an amorphous selenium (a-Se) film of 100 to 1000 μm including selenium as a main component, and generates electric charges within the film when it is irradiated by X-rays. A TFT switch 4 and a charge storage capacitor 5 are provided in the vicinity of the charge collecting electrode 11 disposed in array on the active matrix substrate 10 and a drain electrode of the TFT switch 4 is connected with one electrode of the charge storage capacitor 5. Another electrode of the charge storage capacitor 5 is connected with a storage capacitor line 102. A scan line 101 is connected to a gate electrode of the TFT switch 4, and a data line 3 is connected to a source electrode. A signal detector (amplifier) 105 is connected to a terminal end of the data line 3 (see Japanese Patent Application Laid-open No. 11-190774 and 2001-135809 for example).

Next, a principle of operation of the above mentioned radiation image detector will be explained.

When the X-rays are irradiated from the upper part in FIG. 20, the semiconductor film 6 generates electric charges therein. Among the generated charges, positive holes are collected to the charge collecting electrode 11 by electric potential difference between the bias electrode 7 and the charge collecting electrode 11 and are stored in the charge storage capacitor 5 electrically connected with the charge collecting electrode 11. Because the semiconductor film 6 generates a different amount of electric charges corresponding to a dosage of X-rays, charges corresponding to image information carried by the X-rays are stored in the charge storage capacitor 5 of each pixel. After that, signals for turning the TFT switch 4 ON are sequentially added through the scan line 101 to take out the charges stored in each of the charge storage capacitors 5 via the data line 3. Then it becomes possible to read the image information by detecting an amount of charges of each pixel by the signal detector 105.

Next, a structure of the pixel when the TFT active matrix substrate is manufactured by using a technology for manufacturing a general liquid crystal panel or the like will be explained. FIG. 21 is a section view showing a structure of one pixel unit of the radiation image detector and FIG. 22 is a plan view thereof. FIG. 21 is a section view taken along a line 21-21 in FIG. 22.

As shown in FIG. 21 and FIG. 22, the radiation image detector has a gate electrode 2, the scan line 101, a storage capacitor lower electrode 14 and a storage capacitor line 102 on a glass substrate 1. Then, a gate insulating film 15 is provided on the gate electrode 2, the scan line 101, the storage capacitor lower electrode 14 and the storage capacitor line 102. A semiconductor layer 8 is formed on the gate electrode 2 through an intermediary of the gate insulating film 15. Then, source and drain electrodes 9 and 13 are formed on the semiconductor layer 8. A storage capacitor upper electrode 18 is deposited on a layer composing the charge storage capacitor 5. Then, a data line 3 is provided in the same metal layer with the source electrode 9, the drain electrode 13 and the storage capacitor upper electrode 18. Then, an insulation protecting film 17 is disposed above the data line 3, the storage capacitor upper electrode 18, the source and drain electrodes 9 and 13.

Further, an interlayer insulating film 12 is provided on the insulation protecting film 17. The charge collecting electrode 11 is provided on the interlayer insulating film 12, i.e., at the uppermost layer of the active matrix substrate 10. The charge collecting electrode 11 is connected with the TFT switch 4 via the storage capacitor upper electrode 18 and the drain electrode 13. Furthermore, the data line 3 crosses with the scan line 101 and the storage capacitor line 102 via the gate insulating film 15. Then, the semiconductor film 6 and the bias electrode 7 are formed on the active matrix substrate 10.

In a radiation image detector configured as above, there are two important problems which need to be addressed, these being the drop in production yield of the TFT array and deterioration of the image quality of detected images.

Explanation will first be given of the problem of the production yield of the TFT array.

Defects during production of the TFT array may be divided into the categories of line defects and point defects. Of these, correction of the point defects is possible in the image detector by image correction in image processing, and therefore point defects do not present a major problem. However, line defects, including leakage of storage capacitor lines, scan lines, and data lines, are difficult to physically repair by laser repair or the like in the TFT array process, and also are difficult to rectify by image correction. Therefore, line defects are critical defects and are a cause of increased production costs for TFT arrays.

The scan lines, gate electrodes and storage capacitor line in FIG. 21 are all formed to the same metal layer (gate layer). Therefore, patterning defects occur when forming the gate layer, and if conductive material remains between the storage capacitor line and either the scan lines or the gate electrodes, leak may occur between the scan lines and the storage capacitor lines.

Such defects occur more frequently as the resolution of the image detector gets finer.

Explanation will now be given of the problem of detected images.

It is obviously essential to reduce electronic noise of the radiation image detector to improve image quality of detected images in the radiation image detector constructed as described above. The electronic noise is influenced largely by data line noise caused by a line capacitance in the radiation image detector using the active matrix substrate constructed as described above. Accordingly, in order to improve the image quality of detected images, a reduction in the line capacitance of the data lines is needed.

The line capacitance of the data line, represented as Cd_line, may be expressed as follows:

$$Cd\_line = Ngate \times (Cdgx + Cdcsx + Ctft + Cdp) + Ccom$$

Where, Ngate is a number of scan lines crossing with the data line, Cdgx is a capacitance at an intersection of the data line and the scan line, Cdcsx is a capacitance of an intersection of the data line and the storage capacitor line, Ctft is a capacitance of the TFT section between the data line and the TFT switch, Cdp is a coupling capacitance between the data line and the charge collecting electrode and Ccom is a capacitance between the bias electrode and the data line.

Because Com and Cdp are normally small and may be omitted, Cd_line may be expressed as follows:

$$Cd\_line = Ngate \times (Cdgx + Cdcsx + Ctft)$$

Here, consider a case when a film of 300 nm thick having 7.5 of dielectric constant is used as the gate insulating film 15. A width of the scan line 101 and the storage capacitor line 102 is 10 μm and a width of the data line 3 is 10 μm. While the capacitance of the TFT section is determined by a channel width and a channel length, it is considered to be 0.01 pF. A number of scan lines crossing with the data line is 1,500. Therefore, because Cdgx=0.0256 pF, Cdcsx=0.0256 pF, Ctft=0.01 pF and Ngate=1500, the line capacitance of the data line, Cd_line, becomes=91.8 pF.

Although it is possible to reduce the above mentioned capacitance of the intersections by thickening the gate insulating film 15, a driving capability of the TFT switch 4 drops inversely proportional to that in such a case. Therefore, it becomes necessary to enlarge the size of the TFT switch 4, increasing its area.

In view of the problems described above, the present invention provides an image detector capable of improving the production yield of TFT arrays, and capable of reducing electronic noise and improving the image quality of detected images.

SUMMARY OF THE INVENTION

According to a first aspect of the invention, there is provided an image detector, including: a plurality of scan lines disposed in parallel; a plurality of data lines provided so as to cross with the scan lines, the plurality of data lines being formed in a metal layer that is different from a metal layer in which the scan lines are formed, with an insulating film formed between the two metal layers; thin film transistors connected with the scan lines and data lines and provided in a matrix; sensor sections comprising a semiconductor film that generates charges when irradiated with electromagnetic radiation, the sensor sections being connected to the thin film transistors and provided in a matrix; and a plurality of common lines disposed so as to commonly apply bias voltage to the sensor sections provided in a matrix, the plurality of common lines being formed in a metal layer that is below the semiconductor film of the sensor sections and is a different metal layer from the metal layer in which the scan lines are formed, and is a different metal layer from the metal layer in which the data lines are formed, and there being insulating film formed between adjacent of the metal layers.

Further, in the first aspect of the invention described above, the common lines may be disposed in parallel with the data lines.

Further, in the first aspect of the invention described above, the common lines may be formed by a metal layer by which source and drain electrodes of the thin film transistors are formed.

Further, in the first aspect of the invention described above, each of the sensor sections may further include, a storage capacitor for storing respective electric charges generated in the semiconductor film when electromagnetic waves are irradiated, and the common lines may be connected to the storage capacitor.

Further, in the first aspect of the invention described above, each of the sensor sections may further include, a bias electrode that applies bias voltage to the semiconductor film; and the common lines may be connected to the bias electrodes.

Further, in the first aspect of the invention described above, the data lines may be disposed on the insulating film provided on the metal layer in which the source and drain electrodes of the thin film transistor are formed.

Further, in the first aspect of the invention described above, the image detector may further include, disposed in this sequence: a substrate; a first metal layer that forms the scan lines and the gate electrodes of the thin film transistors; one or more first insulating film(s); a second metal layer that forms the source and drain electrodes of the thin film transistors, the storage capacitors lower electrodes and the common lines; one or more second insulating film(s); a third metal layer that forms the data lines and the storage capacitors upper electrodes; one or more third insulating film(s); a fourth metal layer that forms charge collecting electrodes for collecting the electric charges to the storage capacitors; a semiconductor film that generates the electric charges when it is irradiated by electromagnetic waves; and a bias electrode that applies bias voltage to the semiconductor film.

Further, in the first aspect of the invention described above, the first insulating film(s), the semiconductor film and the second insulating film(s) may be layered between the data lines and the scan lines.

Further, in the first aspect of the invention described above, the storage capacitors upper electrodes may be disposed above the thin film transistors with the second insulating film(s) therebetween.

Further, in the first aspect of the invention described above, the data lines may be extend to an upper part of the thin film transistors.

Further, in the first aspect of the invention described above, a thickness of the second insulating film(s) may be thicker than that of the first insulating film(s).

Still more, in the first aspect of the invention described above, a dielectric constant of the second insulating film(s) may be lower than that of the first insulating film(s).

According to another aspect of the invention, there is provided an image detector, including, disposed in this sequence: a substrate; a first metal layer forming, a plurality of scan lines disposed in parallel, gate electrodes for thin film transistors provided in a matrix, storage capacitor lower electrodes, connected to the thin film transistors and storing charges that have been generated by irradiated electromagnetic waves, and a plurality of common lines, provided for applying bias voltage to the storage capacitor lower electrode; one or more first insulating film(s); a second metal layer, forming source electrodes and drain electrodes of the thin film transistors and forming storage capacitor upper electrodes; one or more second insulating film(s); a third metal layer, forming data lines provided so as to cross with the scan lines; one or more third insulating film(s); a fourth metal layer, forming charge collecting electrodes that accumulate the charges to the storage capacitors; a semiconductor film that generates the electric charges when irradiated with electromagnetic waves; and a bias electrode, applying bias voltage to the semiconductor film.

According to a further more aspect of the invention, there is provided an image detector, including, disposed in this sequence: a substrate; a first metal layer forming, a plurality of scan lines disposed in parallel, and gate electrodes for thin film transistors provided in a matrix; one or more first insulating film(s); a second metal layer, forming source electrodes and drain electrodes of the thin film transistors and forming storage capacitor lower electrodes that store charges that have been generated by irradiated electromagnetic waves; one or more second insulating film(s); a third metal layer, forming data lines provided so as to cross with the scan lines, storage capacitor upper electrodes, and a plurality of common lines provided parallel to the data lines, for applying bias voltage to the storage capacitor lower electrodes; one or more third insulating film(s); a fourth metal layer, forming charge collecting electrodes that accumulate the charges to the storage capacitors; a semiconductor film that generates the electric charges when irradiated with electromagnetic waves; and a bias electrode, applying bias voltage to the semiconductor film.

It is noted that in the image detector comprising the plurality of scan lines disposed in parallel, the plurality of data lines provided so as to cross with the scan lines, thin film transistors connected with the scan lines and data lines and provided in matrix and sensor sections connected to the thin film transistor and provided in matrix, the data line may be disposed on the insulating film provided on the metal layer by which the source and drain electrodes of the thin film transistor are formed.

According to a second aspect of the invention, there is provided a radiation detecting system, including: an image detector according to the first aspect of the invention; a signal processing section for processing signals that have been outputted from the image detector; a storage section for storing the processed signals that have been outputted from the signal processing section; a display section for displaying images based on the processed signal that have been outputted from the signal processing section; and a radiation source for outputting radiation toward the image detector.

According to the first aspect of the invention, the scan lines, data lines and common lines are each formed by metal layers that are different from each other and that have been provided with respective insulating film therebetween, therefore the production yield of the TFT array may be improved. Furthermore, since electronic noise may be reduced, the image quality of detected images may be improved.

BRIEF DESCRIPTION OF THE DRAWINGS

Exemplary embodiments of the present invention will be described in detail based on the following figures, wherein.

DETAILED DESCRIPTION OF THE INVENTION

A radiation image detector to which one exemplary embodiment of an image detector of the invention is applied will be explained below with reference to the drawings.

Figure 1:
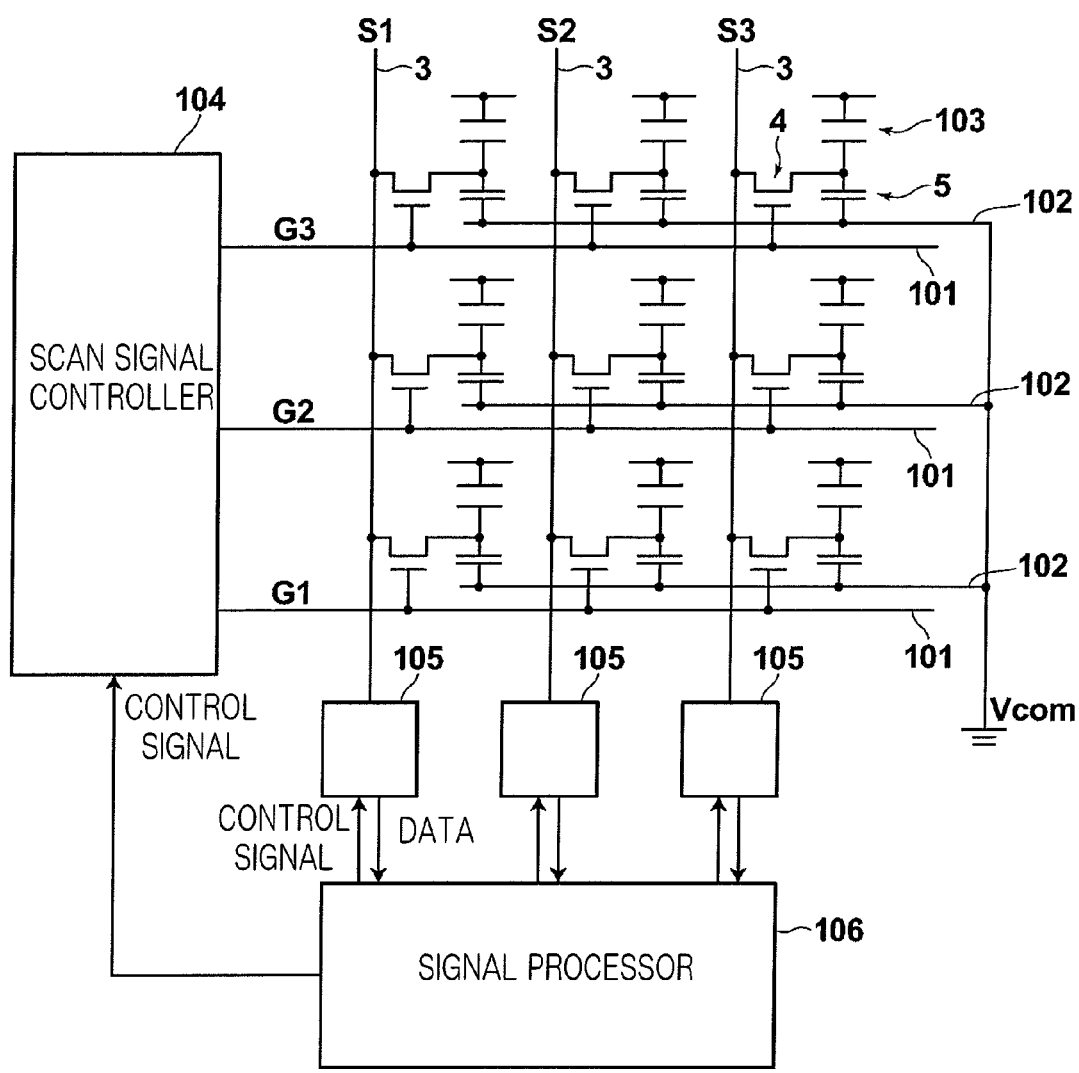
FIG. 1 is an equivalent circuit diagram of an image detector according to a first exemplary embodiment of the invention.

FIG. 1 is an equivalent circuit of the radiation image detector according to a first exemplary embodiment of the invention.

The radiation image detector of the first exemplary embodiment includes a large number of pixels arrayed two-dimensionally, each composed of an image sensor section 103 composed of a bias electrode, a semiconductor film and a charge collecting electrode as described later, a charge storage capacitor 5 for storing charge signals detected by the image sensor section 103 and a thin film transistor (referred to as a "TFT transistor" hereinafter) 4 for reading charges stored in the charge storage capacitor 5. Still more, there are provided a large number of scan lines 101 for turning ON/OFF the TFT switch 4 and a large number of data lines 3 for reading the charges stored in the charge storage capacitor 5. Furthermore, a storage capacitor line 102 is connected to one electrode of each of the charge storage capacitor 5.

Then, each data line 3 is connected with a signal detector 105 for detecting the charges flown out to each data line as an electrical signal and each scan line 101 is connected with a scan signal controller 104 for outputting a control signal for turning ON/OFF the TFT switch 4. Then, each signal detector 105 and the scan signal controller 104 are connected with a signal processor 106 for implementing a predetermined process to the electrical signal detected by each signal detector 105 and for outputting a control signal indicating timing for detecting the signal to each signal detector 105 and the scan signal controller 104 and a control signal indicating timing for outputting a scan signal.

Figure 2:
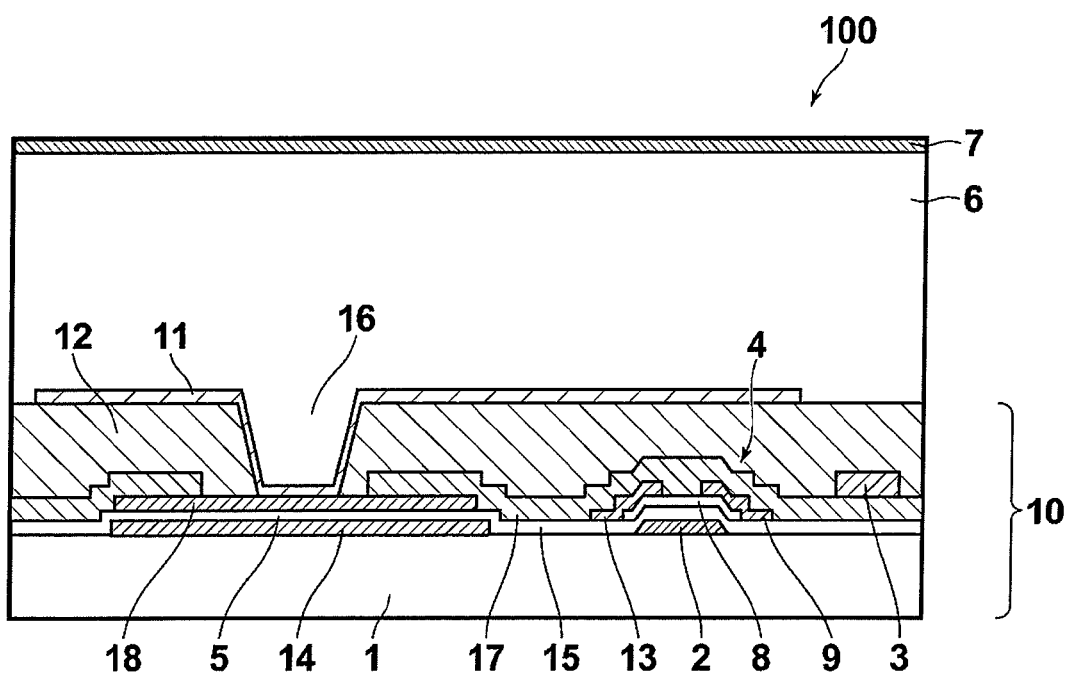
FIG. 2 is a section view showing a structure of one pixel unit of the radiation image detector of the first exemplary embodiment of the invention.
Figure 3:
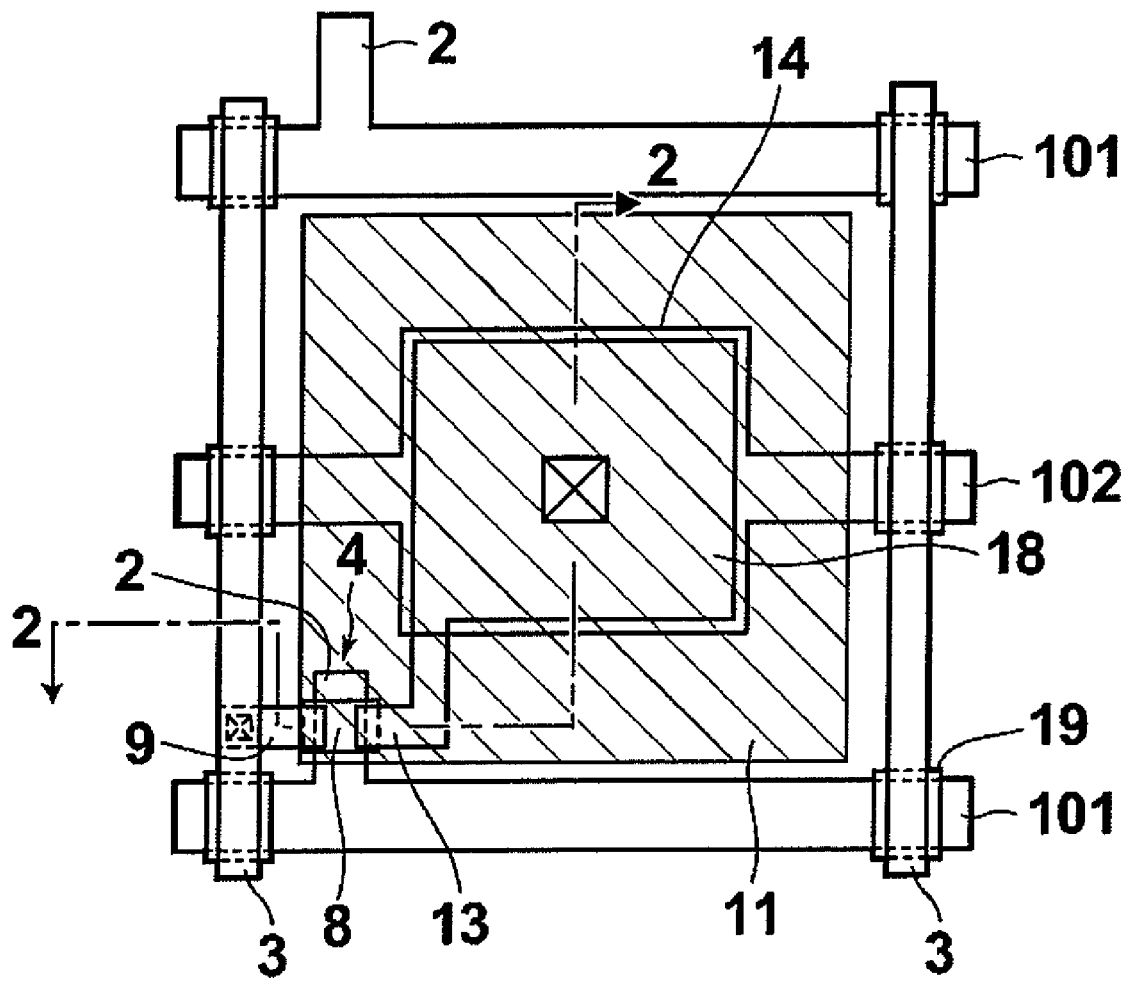
FIG. 3 is a plan view showing the structure of one pixel unit of the radiation image detector of the first exemplary embodiment of the invention.

Here, the radiation image detector 100 of the first exemplary embodiment will be explained in detail. FIG. 2 is a section view showing a structure of one pixel unit of the radiation image detector 100 of the first exemplary embodiment. FIG. 3 is a plan view thereof. FIG. 2 is a section view along a line 2-2 in FIG. 3.

As shown in FIG. 2, a semiconductor film 6 having an electromagnetic wave conductivity and a bias electrode 7 connected to a high voltage source not shown are formed sequentially on the active matrix substrate 10 in the radiation image detector 100 of the first exemplary embodiment. The semiconductor film 6 generates electric charges (electrons—positive holes) therein when it is irradiated by electromagnetic waves such as X-rays. That is, the semiconductor film 6 has the electromagnetic wave conductivity and converts image information of the X-rays into electric charge information. The semiconductor film 6 is made of amorphous selenium (a-Se) whose main component is selenium for example. Here, the 'main component' means to have a content of 50% or more.

The active matrix substrate 10 will be explained in detail below.

The active matrix substrate 10 has a glass substrate 1, a gate electrode 2, a storage capacitor lower electrode 14, a gate insulating film 15, a semiconductor layer 8, a source electrode 9, a drain electrode 13, a storage capacitor upper electrode 18, an insulation protecting film 17, a data line 3, an interlayer insulating film 12 and a charge collecting electrode 11. It is noted that although not shown in FIG. 2, the gate electrode 2 is connected with the scan line 101 as shown in FIG. 3 and the gate electrode 2 and the scan line 101 are formed by the same metal layer. Still more, the storage capacitor lower electrode 14 is connected with the storage capacitor line 102 and the storage capacitor lower electrode 14 and the storage capacitor line 102 are formed by the same metal layer as shown in FIG. 3.

The TFT switch 4 is constructed by the gate electrode 2, the gate insulating film 15, the source electrode 9, the drain electrode 13, the semiconductor layer 8 and others. The charge storage capacitor 5 is constructed by the storage capacitor lower electrode 14, the gate insulating film 15, the storage capacitor upper electrode 18 and others.

The glass substrate 1 is a supporting substrate and a non-alkaline glass substrate, e.g., Coning #1737, may be used for the glass substrate 1. The scan lines 101 and the data lines 3 are electrode lines arrayed in grid and the TFT switch 4 is formed at their intersection as shown in FIG. 3. The TFT switch 4 is a switching element whose source electrode 9 is connected to each of the data lines 3 via a contact hole and whose drain electrode 13 is connected to the storage capacitor upper electrode 18.

The gate insulating film 15 is made of SiNx, SiOx or others. The gate insulating film 15 is provided so as to cover the gate electrode 2, the scan line 101, the storage capacitor lower electrode 14 and the storage capacitor line 102 and a region thereof located on the gate electrode 2 operates as a gate insulating film in the TFT switch 4 and a region thereof located on the storage capacitor lower electrode 14 operates as a dielectric layer in the charge storage capacitor 5. That is, the charge storage capacitor 5 is formed by a region where the storage capacitor lower electrode 14 formed in the same layer with the gate electrode 2 is superimposed with the storage capacitor upper electrode 18.

The semiconductor layer 8 is a channel portion of the TFT switch 4 and is a passage of electric current connecting the source electrode 9 connected to the data line 3 with the drain electrode 13 connected to the storage capacitor upper electrode 18.

The insulation protecting film 17 is formed substantially across the whole area (substantially whole region) of the glass substrate 1. Thereby, it protects and electrically insulates the drain electrode 13 and the source electrode 9. The insulation protecting film 17 has a contact hole 16 at a region located on a portion facing to the storage capacitor lower electrode 14.

The charge collecting electrode 11 is made of an amorphous transparent conductive oxide film. The charge collecting electrode 11 is formed so as to bury the contact hole 16 and is deposited on the source electrode 9, the drain electrode 13 and the storage capacitor upper electrode 18. The charge collecting electrode 11 electrically conducts with the semiconductor film 6 and can collect electric charges generated in the semiconductor film 6.

The interlayer insulating film 12 is made of an acrylic resin having a photosensitivity and electrically insulates the TFT switch 4. The contact hole 16 penetrates through the interlayer insulating film 12 and the charge collecting electrode 11 is connected with the storage capacitor upper electrode 18 through the contact hole 16.

The gate electrode 2, the scan line 101, the storage capacitor lower electrode 14 and the storage capacitor line 102 are provided on the glass substrate 1. The semiconductor layer 8 is formed above the gate electrode 2 via the gate insulating film 15. The source and drain electrodes 9 and 13 are formed on the semiconductor layer 8. The storage capacitor upper electrode 18 is layered above the layers composing the charge storage capacitor 5. An insulation protecting film is disposed above the storage capacitor upper electrode 18, the source and drain electrodes 9 and 13.

The data line 3 is disposed on the insulation protecting film 17. Then, the interlayer insulating film 12 is provided above the insulation protecting film 17 and the data line 3. The charge collecting electrode 11 is provided in an upper layer of the interlayer insulating film 12, i.e., on the uppermost layer of the active matrix substrate 10. The charge collecting electrode 11 is connected with the TFT switch 4 via the storage capacitor upper electrode 18 and the drain electrode 13.

A high voltage source not shown is connected between the bias electrode 7 and the storage capacitor lower electrode 14.

Figure 4:
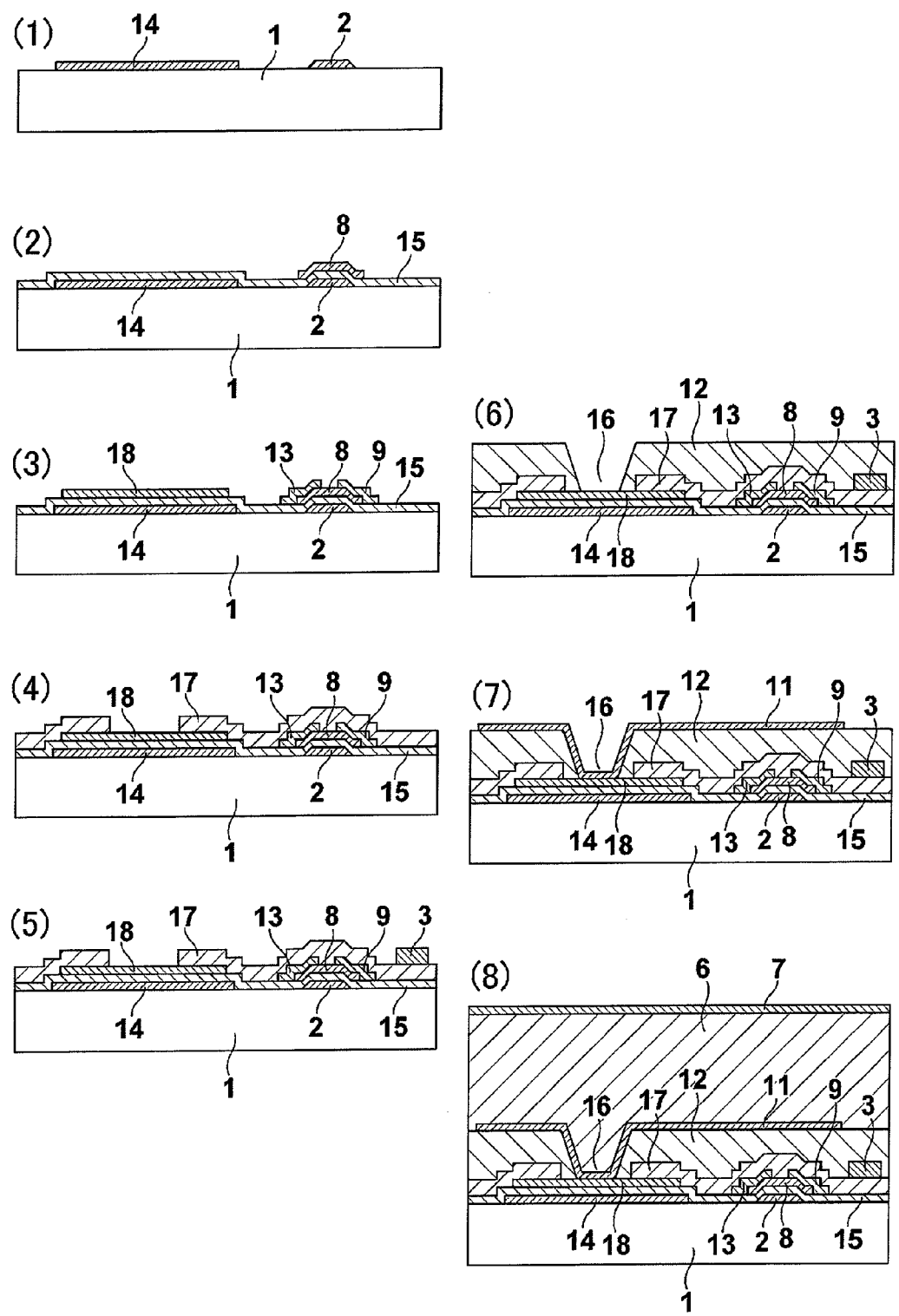
FIG. 4 is a view for explaining the steps for fabricating the radiation image detector of the first exemplary embodiment of the invention.

One exemplary manufacturing step of the radiation image detector of the first exemplary embodiment will be explained with reference to FIG. 4.

At first, the gate electrode 2, the scan line 101, the storage capacitor lower electrode 14 and the storage capacitor line 102 are formed as a gate line layer on the glass substrate 1 (1). The gate line layer is formed by low resistance metals such as Al or Al alloys, or layered films of low resistance metals and barrier metals with high melting point, or a single film of high melting point metals such as Mo. It has a thickness of around 100 to 300 nm and is deposited on the glass substrate 1 by sputtering. Then, patterning of a resist film is carried out by photolithography. After that, the metal film is patterned by wet etching by etchant for Al or by dry etching. Then, the gate line layer is completed by removing the resist.

Next, the gate insulating film 15, the semiconductor layer (amorphous silicon layer) 8 and an impurity doped semiconductor layer (not shown) are sequentially deposited on the gate line layer (2). The gate insulating film 15 is made of SiNx and its thickness is 200 to 600 nm. The semiconductor layer 8 is made of an amorphous silicon layer and its thickness is around 20 to 100 nm. The impurity doped semiconductor layer is made of an impurity doped amorphous silicon layer and its thickness is around 10 to 50 nm. These are deposited by a P-CVD method. After that, patterning of a resist is carried by the photolithography in the same manner with the gate line layer. Then, a semiconductor active region is formed by dry etching the semiconductor layer 8 and the impurity doped semiconductor layer selectively with respect to the gate insulating film.

Next, the source electrode 9, the drain electrode 13 and the storage capacitor upper electrode 18 are formed (3). A source line layer is deposited on an upper layer of the gate insulating film 15 and the semiconductor layer 8. The source line layer is a metal film, similarly to the gate line layer, which is formed by low resistance metals made of Al or Al alloys, or layered films of low resistance metals and barrier metals with high melting point, or a single film of high melting point metals such as Mo. Its thickness is around 100 to 300 nm. Patterning is carried out by the photolithography in the same manner with the case of the gate line layer to pattern the metal film by the wet etching by means of the etchant for Al or by dry etching. At this time, the gate insulating film is not removed. After that, the impurity doped semiconductor layer and the semiconductor layer 8 are partially removed by the dry etching to form a channel region.

The insulation protecting film 17 is deposited on the layers formed as described above (4). The insulation protecting film 17 is made of an inorganic material such as SiNx and $SiO_2$ and is deposited by the P-CVD method. Its thickness is around 200 to 600 nm. Then, patterning of the contact hole is carried out by the photolithography similarly to the case of the gate line layer and the insulation protecting film 17 is selectively patterned by the dry etching.

Next, the data line 3 is formed (5). The data line 3 (layer) is formed on the insulation protecting film 17. This layer is a metal film, similarly to the case of the gate line layer, which is formed by low resistance metals made of Al or Al alloys, or layered films of low resistance metals and barrier metals with high melting point, or a single film of high melting point metals such as Mo. Its thickness is around 100 to 400 nm. Patterning is carried out by the photolithography in the same manner with the case of the gate line layer to pattern the metal film by the wet etching by means of the etchant for Al or by dry etching. At this time, the gate insulating film is not removed.

Next, the interlayer insulating film 12 is deposited on the layers formed as described above (6). The interlayer insulating film is made of an inorganic material such as SiNx and $SiO_2$ or of an organic insulating film material such as SOG and an acrylic resin. Generally, the organic insulating film material is preferable because it has the effect of reducing the capacitance between the data line and the charge collecting electrode because it has a low dielectric constant and is readily thickened. In case of the photosensitive organic insulating film material, the material is applied by spinning into a thickness of around 1 to 3 μm. Then, patterning of the contact hole 16 is carried out by the photolithography. The interlayer insulating film 12 is completed by patterning by using dedicated etchant and by baking it. When the material is not the photosensitive material, the contact hole is formed by implementing dry etching after a photolithographic process similarly to other layers. It is noted that a size of the contact hole 16 is preferable to be smaller than 10 μm squares. When the contact hole 16 is large, crystallization occurs by a stepped portion after forming the semiconductor film 6.

Next, the charge collecting electrode 11 is formed (7). A transparent electrode material such as ITO is deposited by sputtering on the layers formed as described above. Its thickness is around 20 to 200 nm. Then, patterning is carried out by the photolithography and the electrode is patterned by wet etching by etchant for ITO or by dry etching. At this time, the underlying interlayer insulating film is not damaged by adopting the etching selectively.

Next, the semiconductor film 6 and the bias electrode 7 are formed (8). The semiconductor film 6 made of a-Se and having the electromagnetic wave conductivity is formed into a thickness of 0.5 mm to 1.5 mm for the use of general radiography for medical diagnoses by a vacuum evaporation method on the layers formed as described above. Then, finally, the bias electrode 7 made of Au, Al or others is formed substantially on the whole surface of the semiconductor film 6 into a thickness of about 100 nm by the vacuum evaporation.

Next, the principle of operation of the radiation image detector having the above-mentioned structure will be explained. When X-rays are irradiated to the semiconductor film 6 while applying a voltage between the bias electrode 7 and the storage capacitor lower electrode 14, the semiconductor film 6 generates electric charges (pairs of electron—positive hole) therein. Then, because the semiconductor film 6 is arranged to be electrically connected with the charge storage capacitor 5 in series, electrons generated within the semiconductor film 6 move to the side of +electrode and positive holes move to the side of—electrode. As a result, electric charges are stored in the charge storage capacitor 5.

It is then possible to take out the charges stored in the charge storage capacitor 5 to the outside via the data line 3 by turning ON the TFT switch 4 by an input signal to the scan line 101.

Then, because the scan line 101, the data line 3, the TFT switch 4 and the charge storage capacitor 5 are all provided in matrix of X and Y, it is possible to obtain image information of the X-rays two dimensionally by sequentially scanning the signals inputted to the scan line 101 and by detecting signals from each data line 3.

In the radiation image detector 100 of the first exemplary embodiment as shown in FIG. 2, the data line 3 is formed in the upper layer of the source and drain electrodes 9 and 13 via the insulation protecting film 17. Therefore, the gate insulating film 15 and the insulation protecting film 17 exist at the intersection of the data line 3 with the scan line 101 and at the intersection of the data line 3 with the storage capacitor line 102. Accordingly, the line capacitance of the data line 3 may be reduced. Meanwhile, only the gate insulating film 15 exists at the charge storage capacitor 5 and the TFT switch 4, so that it is possible to prevent an electrode area of the storage capacitor from expanding and a TFT driving capability from dropping.

Furthermore, in the TFT switch production process, leakage frequently occurs between the gate line layer and the source line layer due to electrostatic breakdown. When the structure of the radiation image detector of the first exemplary embodiment is adopted, the insulating film between the source and gate electrodes of the TFT switch is thinner than that of the intersection of the data line with the scan line, so that a withstand voltage is set low. Thereby, even when the failure of leak occurs due to the static electricity, there is a high probability that it becomes a failure of leak of the TFT switch. Although it becomes a failure of lines when the failure of leak occurs between the lines, it is possible to end as a failure of a single pixel when a failure of leak occurs in the TFT switch by disconnecting the TFT switch. Normally, the radiation image detector may be improved by generating information on a defective pixel from data of neighboring pixels and by compensating an image. However, it is difficult to correct the image by interpolation of images in case of the failure of lines. Accordingly, it is possible to improve a production yield by avoiding the failure of lines as described above.

Still more, it is preferable to increase the thickness of the data line because its resistance needs to be lowered. That is, it is desirable to thicken the metal layer of the data line more than the metal layer of the source and drain electrodes. The thickness of the metal layer is limited because an accuracy of patterning drops when the source and drain electrodes are formed in the same layer and when its thickness increases. However, according to the radiation image detector of the first exemplary embodiment, the data line is formed in the layer different from the source electrode and the drain electrode, so that it becomes possible to increase the thickness of the data line and to realize a low resistant data line, reducing the noise of the data line. Further, production process time may be reduced since the thickness of the metal layer of the source electrode and the drain electrode may be made thin.

Next, the line capacitance of the data line of the radiation image detector of the first exemplary embodiment will be explained by using specific numerical values.

As described above, the line capacitance of the data line Cd_line may be expressed as follows:

$$Cd\_line \approx Ngate \times (Cdgx + Cdcsx + Ctft)$$

Here, SiNx is used as the gate insulating film 15 and its thickness is 300 nm and its dielectric constant is 7.5. Meanwhile, SiNx is used also for the insulation protecting film 17 and its thickness is 300 nm and its dielectric constant is 7.5. A line width of the scan line 101 and the storage capacitor line 102 is 10 μm and a line width of the data line 3 is 10 μm. While the capacitance of the TFT section is determined by a channel width W and a channel length L, one having 0.01 pF is used this time. A number of gate lines is 1,500. Then, in a conventional structure, because Cdgx=0.0256 pF, Cdcsx=0.0256 pF, Ctft=0.01 pF and Ngate=1500, the line capacitance of the data line, Cd_line, becomes=91.8 pF. In contrast, in the structure of the radiation image detector of the first exemplary embodiment, Cdgx=0.0096 pF, Cdcsx=0.0096 pF, so that the line capacitance of the data line, Cd_line, is=43.8 pF. Accordingly, the line capacitance of the data line may be reduced to 48% and the electronic noise may be reduced accordingly.

It is noted that in the radiation image detector of the first exemplary embodiment, a semiconductor layer 19 may be provided between the gate insulating film 15 and the insulation protecting film 17 at the intersection of the data line 3 with the scan line 101 as shown in FIG. 3. It becomes possible to reduce the capacitance of the intersection of the data line 3 with the scan line 101 further by constructing as described above. Furthermore, because it is possible to prevent a reduction of the gate insulating film 15 by etching of the semiconductor layer and the source electrode layer by providing the semiconductor layer 19, it is possible to reduce the electronic noise because the remaining film of the gate insulating film 15 is thick and a low capacitance may be realized.

Figure 5:
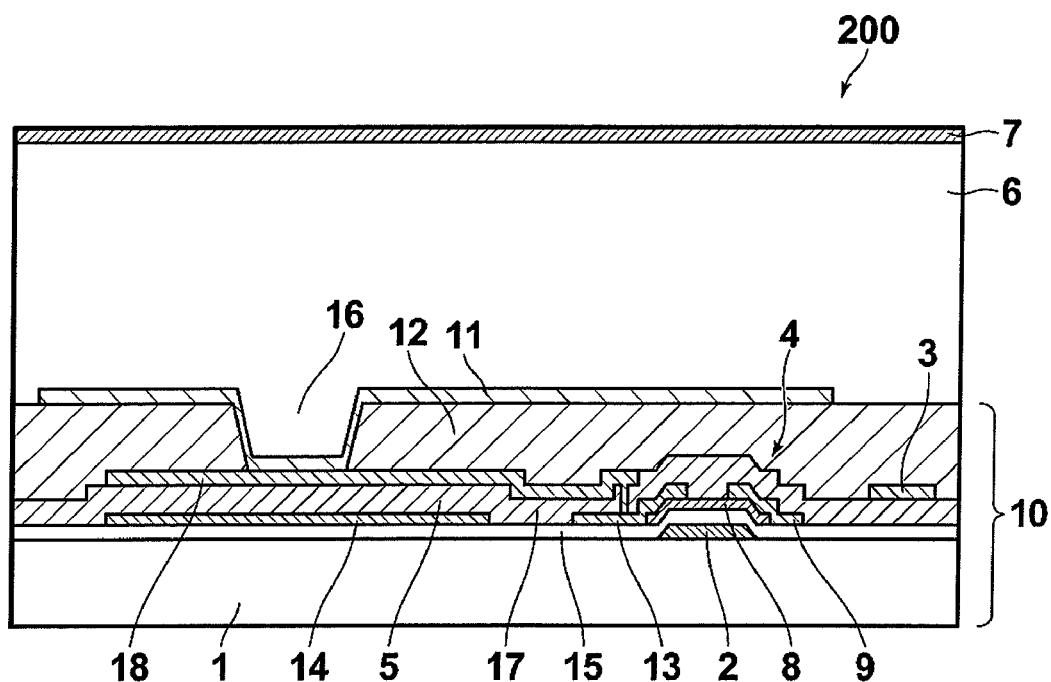
FIG. 5 is a section view showing a structure of one pixel unit of a radiation image detector of a second exemplary embodiment of the invention.
Figure 6:
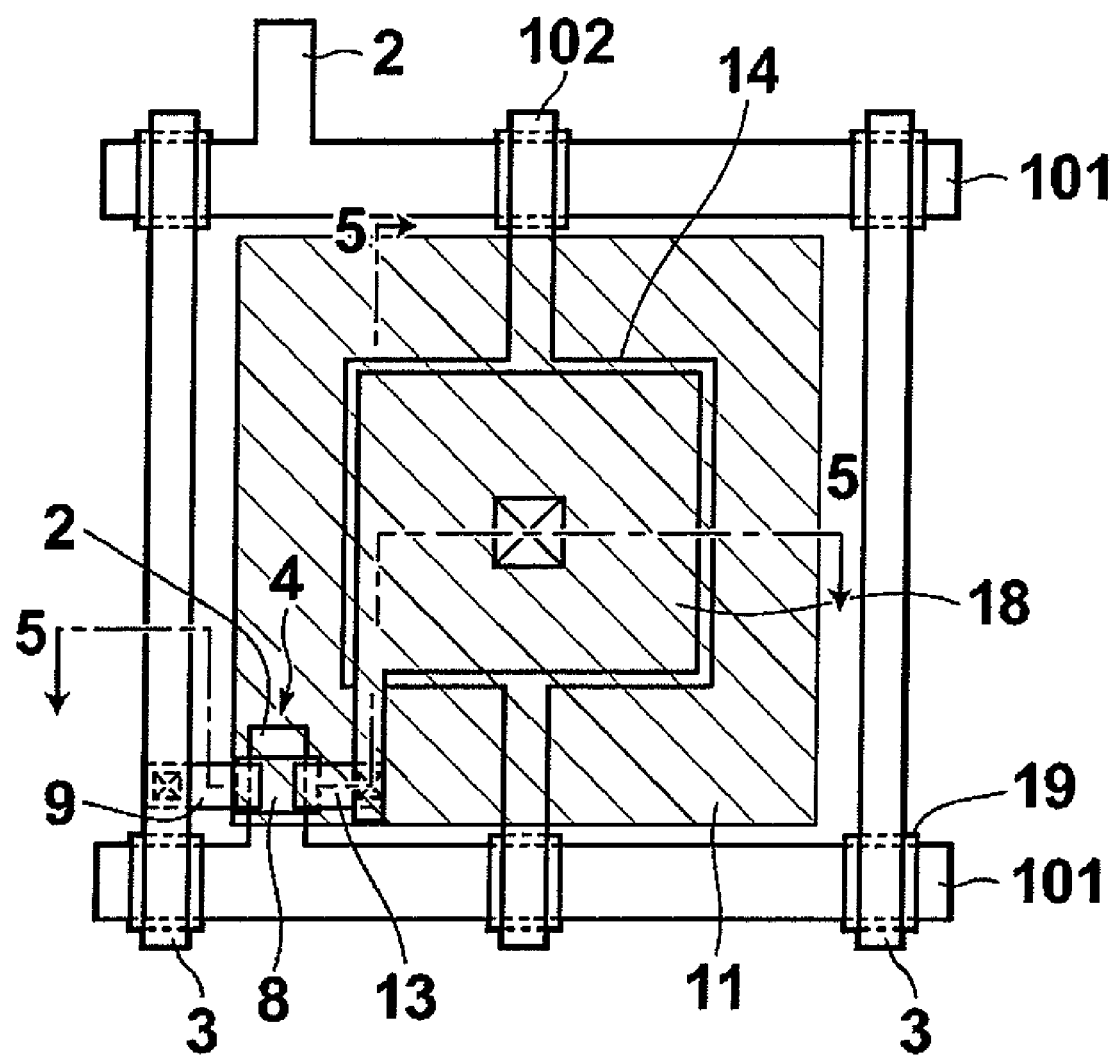
FIG. 6 is a plan view showing the structure of one pixel unit of the radiation image detector of the second exemplary embodiment of the invention.
Figure 23:
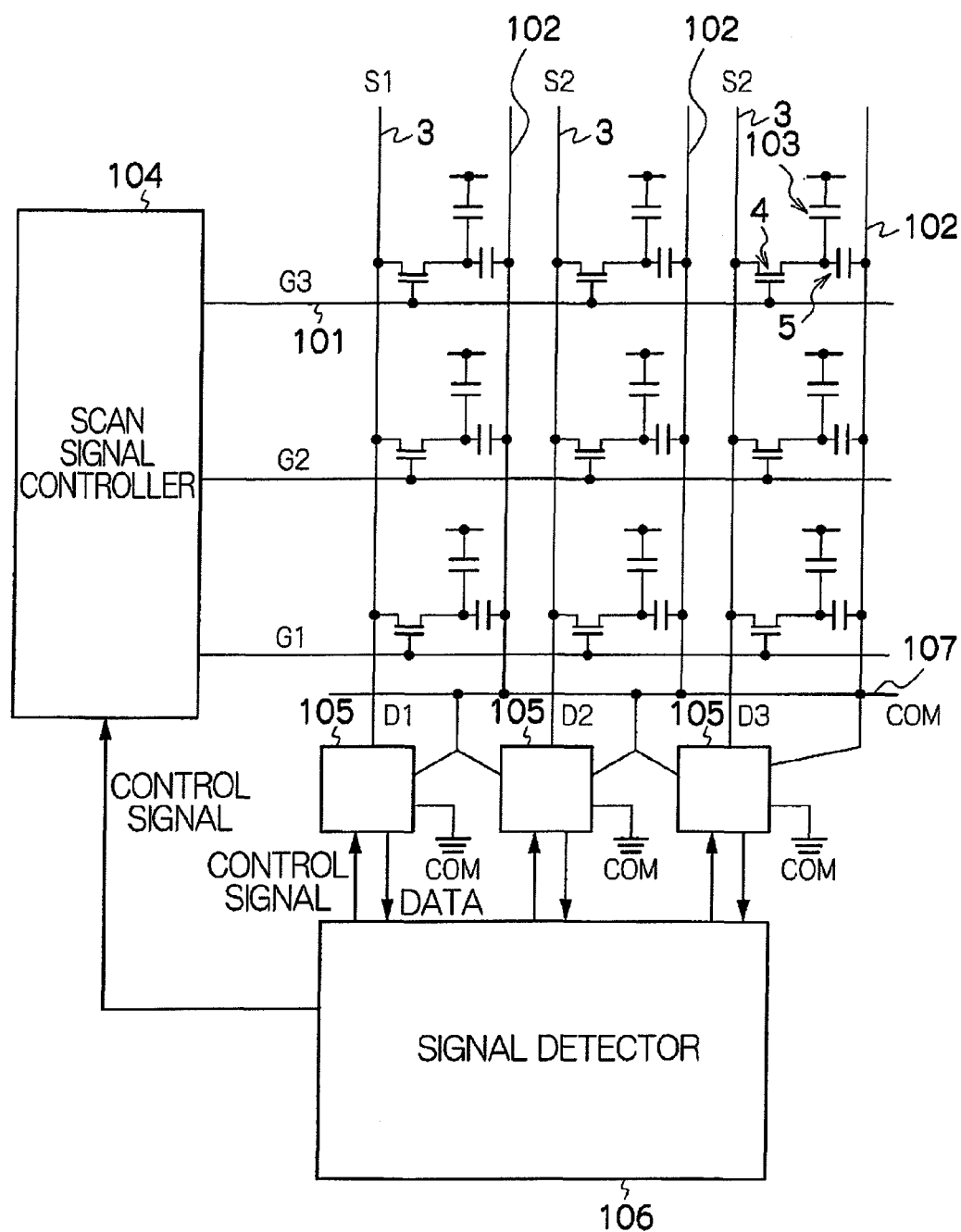
FIG. 23 is an equivalent circuit diagram of the image detector of the second and third exemplary embodiments of the invention.

Next, a radiation image detector 200 of a second exemplary embodiment will be explained. FIG. 23 is an equivalent circuit of the radiation image detector 200 of the second exemplary embodiment. FIG. 5 is a section view showing a structure of one pixel unit of the radiation image detector 200 of a second exemplary embodiment and FIG. 6 is a plan view thereof. FIG. 5 is a section view along a line 5-5 in FIG. 6.

The radiation image detector 200 of the second exemplary embodiment is different from the radiation image detector of the first exemplary embodiment in the positions of the storage capacitor lower electrode 14, the storage capacitor line 102 and the position of the storage capacitor upper electrode 18. Then, the storage capacitor line 102 of the radiation image detector 200 of the second exemplary embodiment is disposed in parallel with the data line 3 as shown in FIG. 23 and FIG. 6. The storage capacitor line 102 is connected with a line 107 on the outside of a region of the sensor array section where the image sensor section 103 is provided per a predetermined number of lines. The line 107 is connected the respective signal detectors 105. A predetermined voltage Vcom is applied from the signal detector 105 to each of the storage capacitor line 102 via the line 107. It is noted that FIG. 23 is simplified by connecting each of the storage capacitor lines 102 to one line 107. The other components are the same with those of the first exemplary embodiment.

As shown in FIG. 5, the gate electrode 2 and the scan line 101 are provided on the glass substrate 1 of the radiation image detector 200 of the second exemplary embodiment. The gate insulating film 15 is provided above the gate electrode 2 and the scan line 101. The semiconductor layer 8 is formed above the gate electrode 2 via the gate insulating film 15. The source and drain electrodes 9 and 13 are formed on the semiconductor layer 8. Then, the storage capacitor lower electrode 14 and the storage capacitor line 102 are formed in the same metal layer with the source and drain electrodes 9 and 13. Then, the insulation protecting film 17 is formed above the source electrode 9, the drain electrode 13, the storage capacitor lower electrode 14 and the storage capacitor line 102.

The data line 3 is disposed on the insulation protecting film 17 and the storage capacitor upper electrode 18 is formed in the same metal layer with the data line 3. Then, the interlayer insulating film 12 is provided above the storage capacitor upper electrode 18 and the data line 3. The charge collecting electrode 11 is provided in an upper layer of the interlayer insulating film 12. The charge collecting electrode 11 is connected with the TFT switch 4 via the storage capacitor upper electrode 18 and the drain electrode 13.

The charge collecting electrode 11 is also connected with the storage capacitor upper electrode 18 by the contact hole 16 that penetrates through the interlayer insulating film 12. It is noted that the size of the contact hole 16 is preferable to be smaller than 10 μm squares. When the contact hole 16 is large, crystallization occurs by the stepped portion after forming the semiconductor film 6.

The storage capacitor upper electrode 18 is also connected with the drain electrode 13 by the contact hole.

Figure 7:
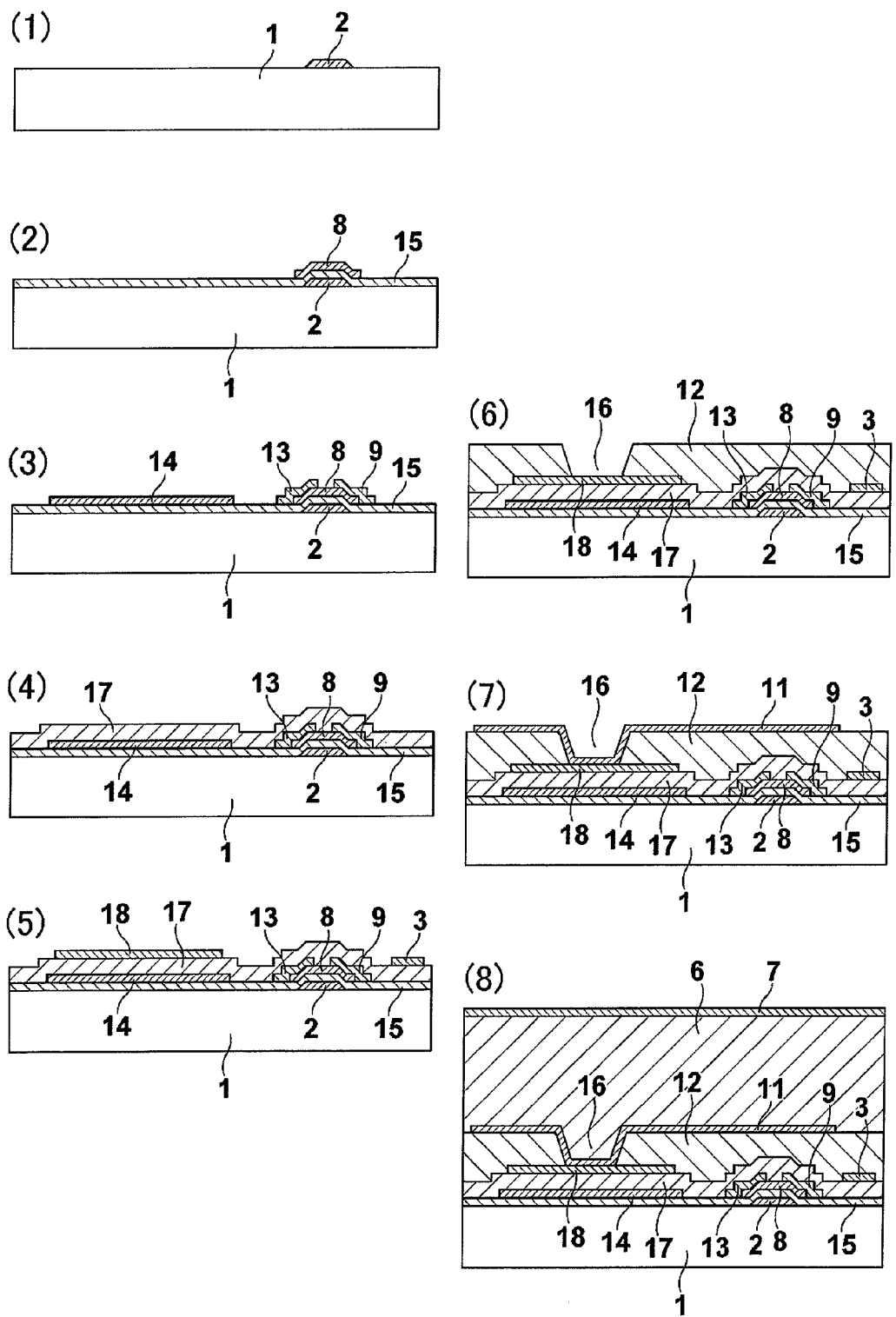
FIG. 7 is a view for explaining the steps for fabricating the radiation image detector of the second exemplary embodiment of the invention.

One exemplary manufacturing step of the radiation image detector of the second exemplary embodiment will be explained below with reference to FIG. 7. It is noted that the detail of the manufacturing step and the materials of the radiation image detector of the second exemplary embodiment are the same with the radiation image detector of the first exemplary embodiment.

The gate electrode 2 and the scan line 101 are formed as the gate line layer on the glass substrate 1 at first (1). Next, the gate insulating film 15, the semiconductor layer 8 and the impurity added semiconductor layer (not shown) are sequentially deposited on the gate line layer (2). Then, the source electrode 9, the drain electrode 13, the storage capacitor lower electrode 14 and the storage capacitor line 102 are formed (3). Next, the insulation protecting film 17 is deposited on the layers formed as described above (4). Next, the data line 3 and the storage capacitor upper electrode 18 are formed (5). Then, the interlayer insulating film 12 is deposited on the layers formed as described above (6). Then, the charge collecting electrode 11 is formed (7) and the semiconductor film 6 and the bias electrode 7 are formed thereon (8).

Similarly to the radiation image detector 100 of the first exemplary embodiment, the data line 3 is formed in the upper layer of the source and drain electrodes 9 and 13 via the insulation protecting film 17 in the radiation image detector 200 of the second exemplary embodiment. Therefore, the gate insulating film 15 and the insulation protecting film 17 exist at the intersection of the data line 3 with the scan line 101 and at the intersection of the data line 3 with the storage capacitor line 102. Accordingly, the line capacitance of the data line 3 may be reduced. Meanwhile, only the gate insulating film 15 exists at the charge storage capacitor 5 and the TFT switch 4, so that it is possible to prevent the electrode area of the storage capacitor from expanding and the TFT driving capability from dropping.

Furthermore, the insulating film between the source and gate electrodes of the TFT switch is thinner than that of the intersection of the data line with the scan line similarly to that of the radiation image detector 100 of the first exemplary embodiment, so that a withstand voltage is set low. Thereby, even when a failure of leak occurs due to static electricity, there is a high probability that it becomes a failure of leak of the TFT switch. Although it becomes a failure of lines when the failure of leak occurs between the lines, it is possible to end as a failure of a single pixel when a failure of leak occurs in the TFT switch by disconnecting the TFT switch. Normally, the radiation image detector may be improved by generating information on a defective pixel from data of neighboring pixels and by compensating an image. However, it is difficult to correct the image by interpolation of images in many times in case of the failure of lines. Accordingly, it is possible to improve a production yield by avoiding the failure of lines as described above.

Furthermore, the storage capacitor line 102 is formed in a separate layer of metallic material from that of the scan line 101, with gate insulating film 15 therebetween, and formed in a separate layer of metallic material from that of the data lines 3, with the insulation protecting film 17 therebetween. By so doing, if patterning defects occur during formation of the storage capacitor line 102, even if there are the remains of a conductive material film, leakage do not occur with the scan line 101 and the data lines 3. Thereby, the production yield of the TFT array of the image detector is greatly improved, and hence this configuration is particularly effective for the manufacture of high precision image detector TFT arrays (pixel pitch of <200 μm). For example, if the pixel pitch is 200 μm, the data lines 3 line width is 10 μm, and the storage capacitor line 102 line width is 10 μm, then the gap between lines is only 90 μm (in addition, for example, if the storage capacitor upper electrode 18 of the charge storage capacitor 5 or the storage capacitor lower electrode 14 are formed in the same layer, and if, say, the width of the storage capacitor upper electrode 18 or the storage capacitor lower electrode 14 is 10 μm, then the gap between lines is only 40 μm). However, by forming the storage capacitor line 102, the scan line 101 and the data lines 3 in separate layers, even if there are patterning defects that occur when forming the lines and there are the remains of a conductive material film, leakage do not occur between the storage capacitor line 102 and the data lines 3.

Furthermore, the storage capacitor line 102 is formed in a lower layer to that of the semiconductor film 6. By so doing, the lines of the storage capacitor line 102 are formed in a prior step/process to that for forming the semiconductor film 6, and the productivity of the production line for manufacturing the radiation image detector 100 may be improved.

That is to say, in the radiation image detector 100, in order to maintain sufficient detection sensitivity it is necessary to form the semiconductor film 6 as a thicker film compared to other layers on the active matrix substrate 10. For example, in the present exemplary embodiment, the semiconductor film 6 is vacuum deposited as a 0.5 mm to 1.5 mm thick a-Se film. The deposition process for forming such a semiconductor film 6 requires a long processing time, and incurs a high production cost. With regard to this, the semiconductor film 6 is only formed on the active matrix substrates 10 that have completed the forming of the main line layers below the semiconductor film 6, and that have been determined to be of good quality by image inspection at each of the processes, and by continuity tests and the like. In this manner, the number of wafers that are processed in the inherently low productivity deposition process for the semiconductor film 6 layer may be reduced, and the overall productivity improved.

Still more, it is possible to increase the thickness of the data line 3, to realize the low resistant data line and to reduce the data line noise in the same manner with the radiation image detector 100 of the first exemplary embodiment. In other words, it is desirable to increase the thickness of the metal layer of the data line so that it is more than the thickness of the metal layer of the source and drain electrodes.

Furthermore, since intersections of the storage capacitor line 102 with the data lines 3 disappear as a result of disposing the storage capacitor line 102 parallel to the data lines 3, the capacitance of the intersections of the storage capacitor line 102 with the data lines 3 may be reduced, and further electronic noise reduction may be made.

Furthermore, because the charge storage capacitor 5 is composed of the storage capacitor lower electrode 14, the insulation protecting film 17 and the storage capacitor upper electrode 18, the charge storage capacitor 5 may be constructed by the insulating film different from the gate insulating film 15 composing the TFT switch 4. When the charge storage capacitor 5 is constructed by the gate insulating film 15 and when the gate insulating film 15 is thinned to increase ON current of the TFT switch 4, the storage capacitance of the charge storage capacitor 5 also increases proportionally. However, because the storage capacitance of the charge storage capacitor 5 does not increase even when the gate insulating film 15 is thinned in the radiation image detector of the second exemplary embodiment, it is possible to shorten a charge transfer time of the pixel. As a result, it becomes possible to design an ideal sensor element and to reduce the electronic noise.

Next, the line capacitance of the data line of the radiation image detector of the second exemplary embodiment will be explained by using specific numerical values.

As described above, the line capacitance of the data line Cd_line may be expressed as follows:

$$Cd\_line \approx Ngate \times (Cdgx + Cdcsx + Ctft)$$

Here, SiNx is used as the gate insulating film 15 and its thickness is 300 nm and its dielectric constant is 7.5. Meanwhile, SiNx is used also for the insulation protecting film 17 and its thickness is 500 nm and its dielectric constant is 7.5. A width of the scan line 101 and the storage capacitor line 102 is 10 μm and a width of the data line 3 is 10 μm. While the capacitance of the TFT section is determined by a channel width W and a channel length L, one having 0.01 pF is adopted this time. A number of gate lines is 1,500. Then, in a conventional structure, because Cdgx=0.0256 pF, Cdcsx=0.0256 pF, Ctft=0.01 pF and Ngate=1500, the line capacitance of the data line, Cd_line, becomes=91.8 pF. In contrast, in the structure of the radiation image detector of the second exemplary embodiment, Cdgx=0.0096 pF, Cdcsx=0 pF (because there is no intersection of the data line and the storage capacitor line), so that the line capacitance of the data line, Cd_line, becomes=29.4 pF. Accordingly, the line capacitance of the data line may be reduced to 32% and the electronic noise may be reduced accordingly.

It is noted that the semiconductor layer 19 may be provided between the gate insulating film 15 and the insulation protecting film 17 at the intersection of the data line 3 with the scan line 101 as shown in FIG. 6 also in the radiation image detector of the second exemplary embodiment. It is possible to lower the capacitance of the intersection of the data line 3 with the scan line 101 further by arranging as described above.

Figure 8:
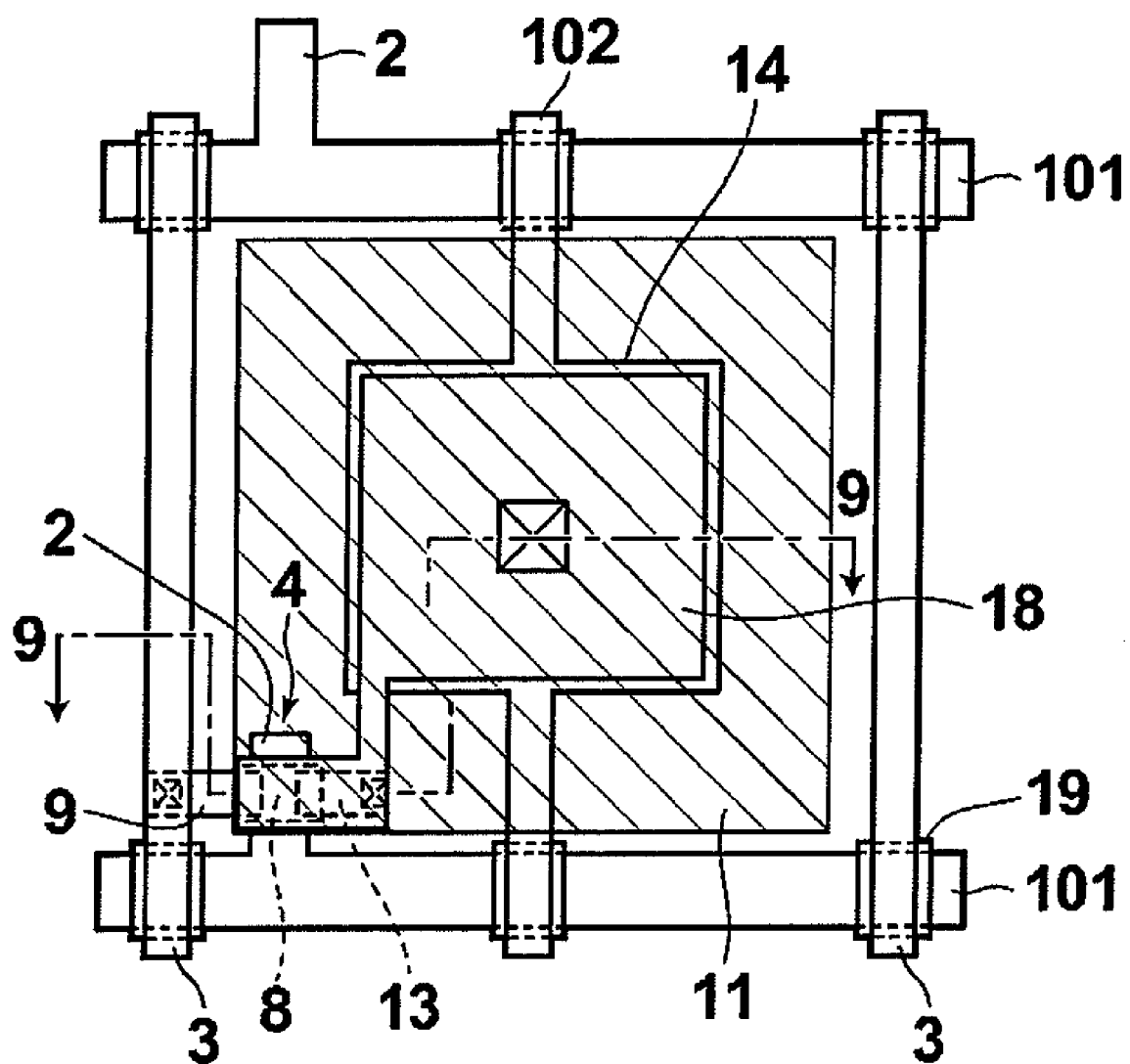
FIG. 8 is a plan view showing a structure of one pixel unit of a modified example of the radiation image detector of the second exemplary embodiment of the invention.
Figure 9:
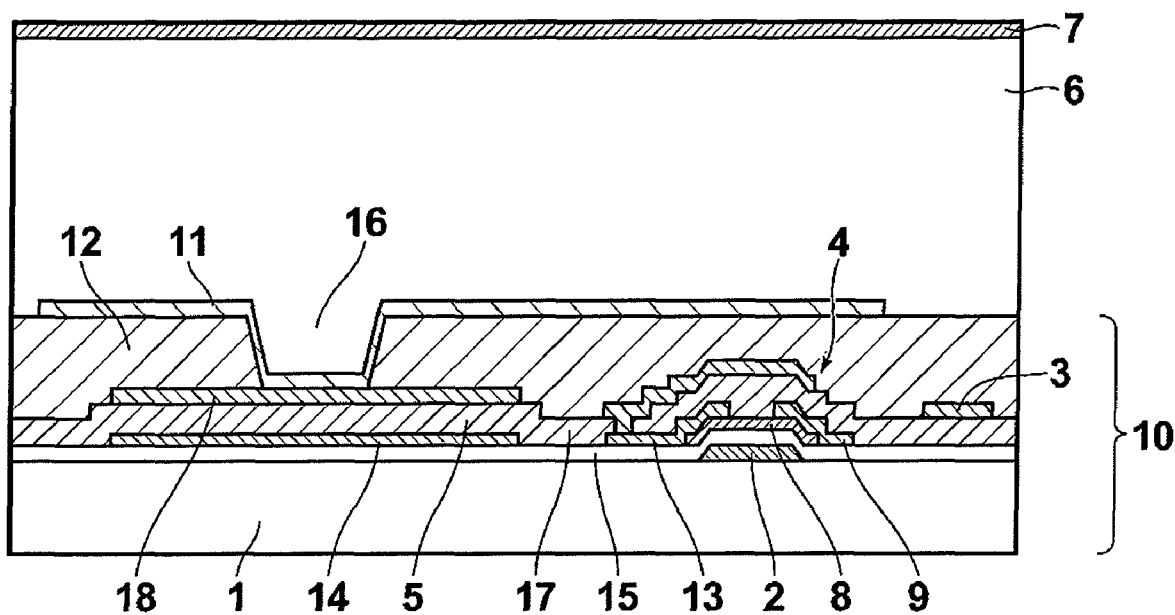
FIG. 9 is a section view showing a structure of one pixel unit of the modified example of the radiation image detector of the second exemplary embodiment of the invention.
Figure 10:
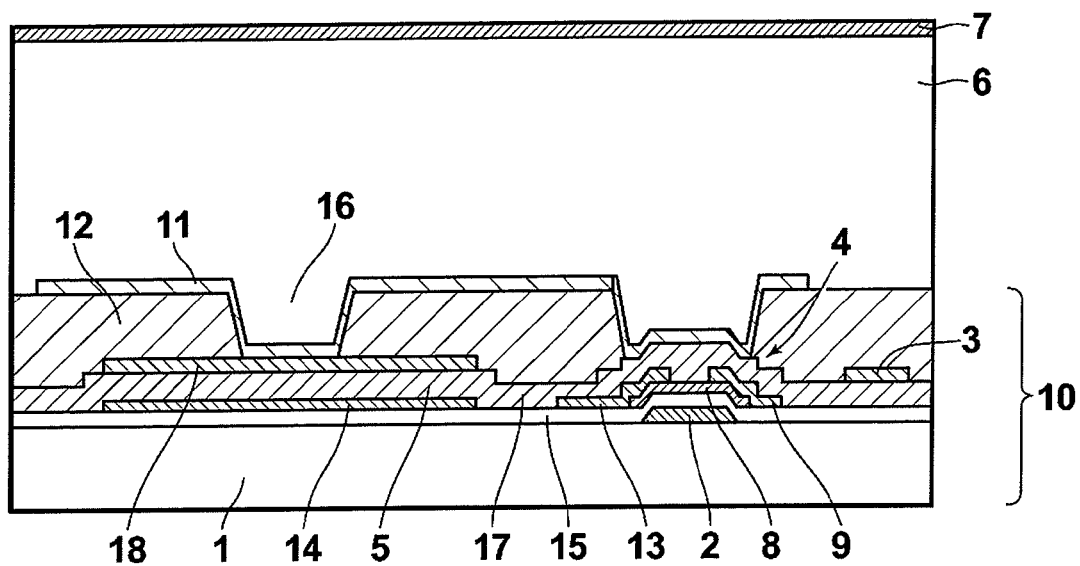
FIG. 10 is a section view showing a structure of one pixel unit of the modified example of the radiation image detector of the second exemplary embodiment of the invention.

Furthermore, the storage capacitor upper electrode 18 may be extended so that it is disposed above the TFT switch 4 via the insulation protecting film 17 as shown in FIG. 8 in the radiation image detector of the second exemplary embodiment. FIG. 9 is a section view along a line 9-9 in FIG. 8. For example, when the application to the bias electrode of the radiation image detector is a positive bias, the electric charges stored in the charge storage capacitor 5 becomes positive. However, it becomes possible to realize a structure by which the TFT switch 4 automatically turns ON when the stored charges become large by extending the storage capacitor upper electrode 18 connected with the charge collecting electrode 11 over the TFT switch 4 as shown in FIG. 8 and FIG. 9. Thereby, it becomes possible to avoid the pixel from being broken by the large stored charge.

Furthermore, it is also possible to arrange the radiation image detector of the second exemplary embodiment so that the interlayer insulating film above the TFT switch 4 is removed. Thereby, a threshold voltage that automatically turns ON the TFT switch 4 when the stored charges of the pixel become large may be lowered, so that it is possible to avoid the pixel from being broken more effectively.

Figure 11:
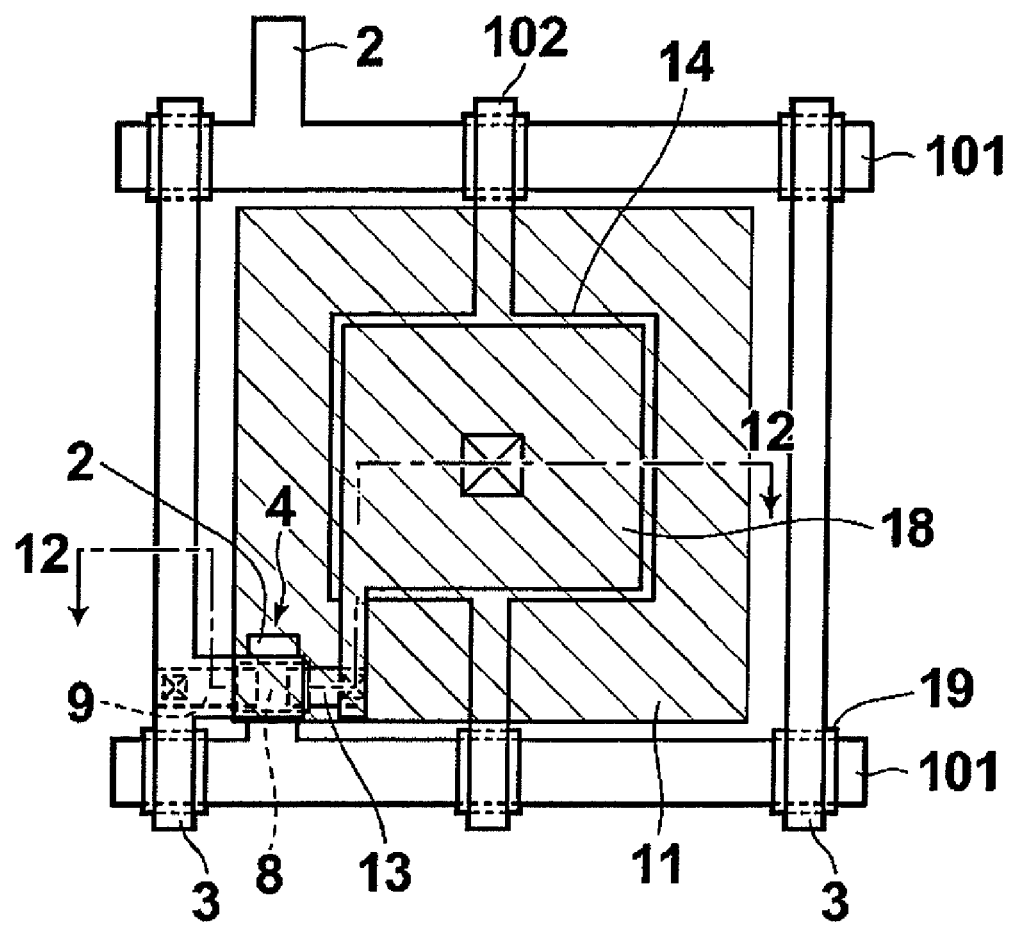
FIG. 11 is a plan view showing a structure of one pixel unit of the modified example of the radiation image detector of the second exemplary embodiment of the invention.
Figure 12:
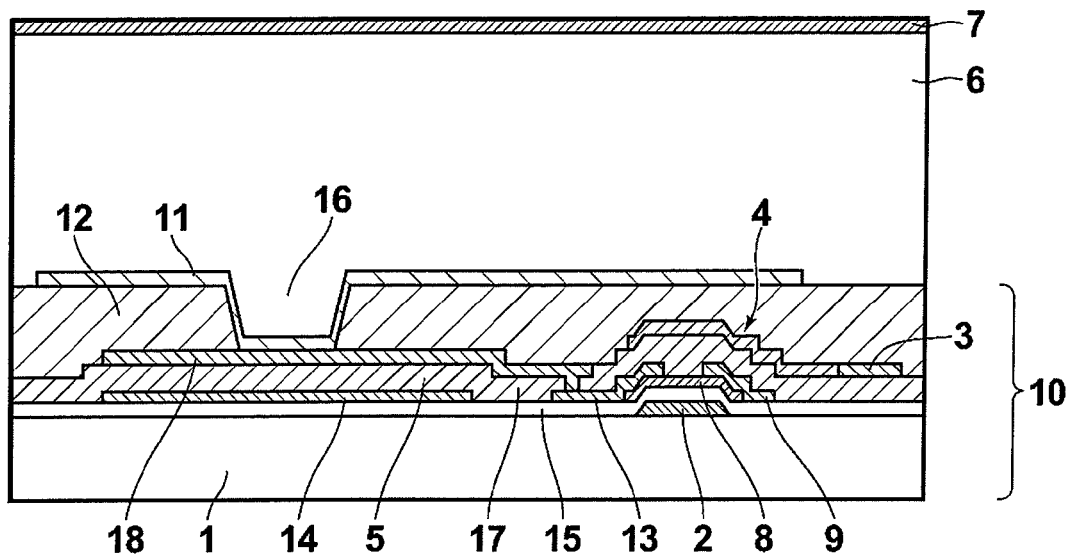
FIG. 12 is a section view showing a structure of one pixel unit of the modified example of the radiation image detector of the second exemplary embodiment of the invention.

Still more, the data line 3 may be extended above the TFT switch 4 as shown in FIG. 11 in the radiation image detector of the second exemplary embodiment. FIG. 12 is a section view along a line 12-12. It is possible to realize a shield structure to electric potential of the charge collecting electrode 11 by constructing as described above. For example, even if 100 V is applied to the charge collecting electrode 11, no electric field is applied to a back channel of the TFT switch 4 if the potential of the data line 3 is 0 V.

Figure 13:
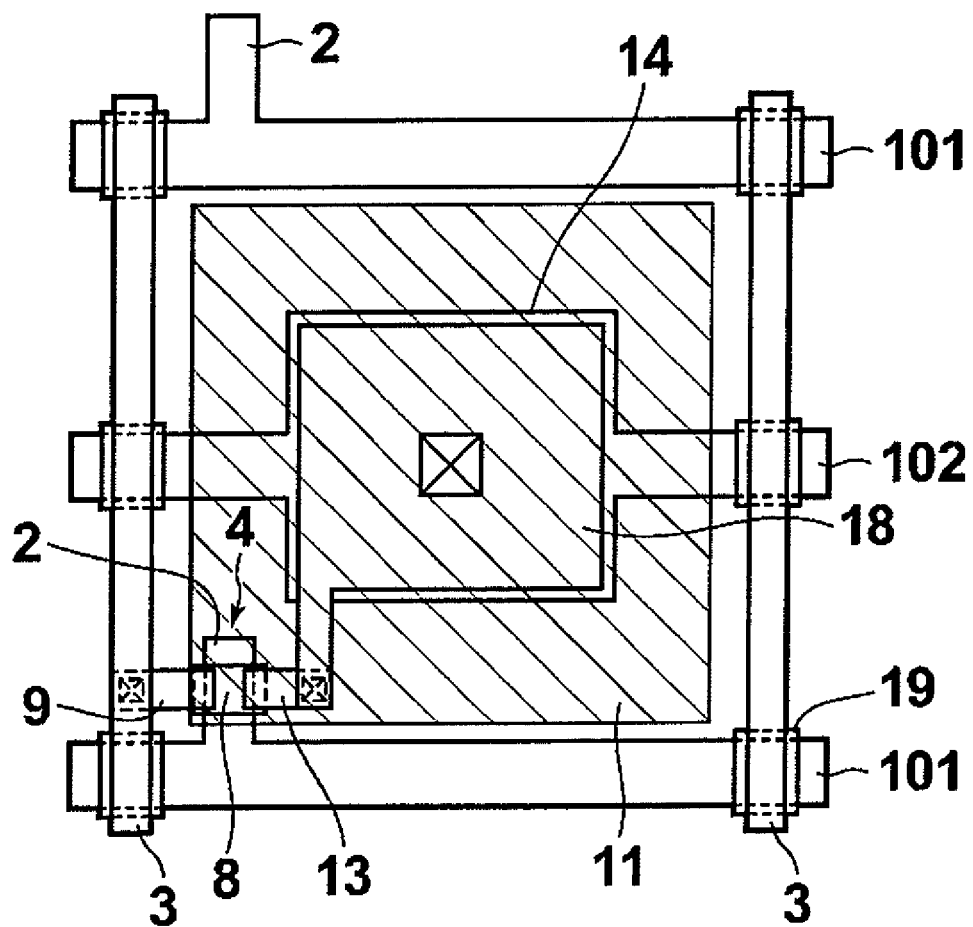
FIG. 13 is a plan view showing a structure of one pixel unit of the modified example of the radiation image detector of the second exemplary embodiment of the invention.

Furthermore, although the storage capacitor line 102 is disposed so as to run in parallel with the data line 3 in the radiation image detector of the second exemplary embodiment, the storage capacitor line 102 may be provided so as to run in parallel with the scan line 101 as shown in FIG. 13. It is noted that the structure of layers and the manufacturing step are the same with the radiation image detector of the second exemplary embodiment.

Figure 14:
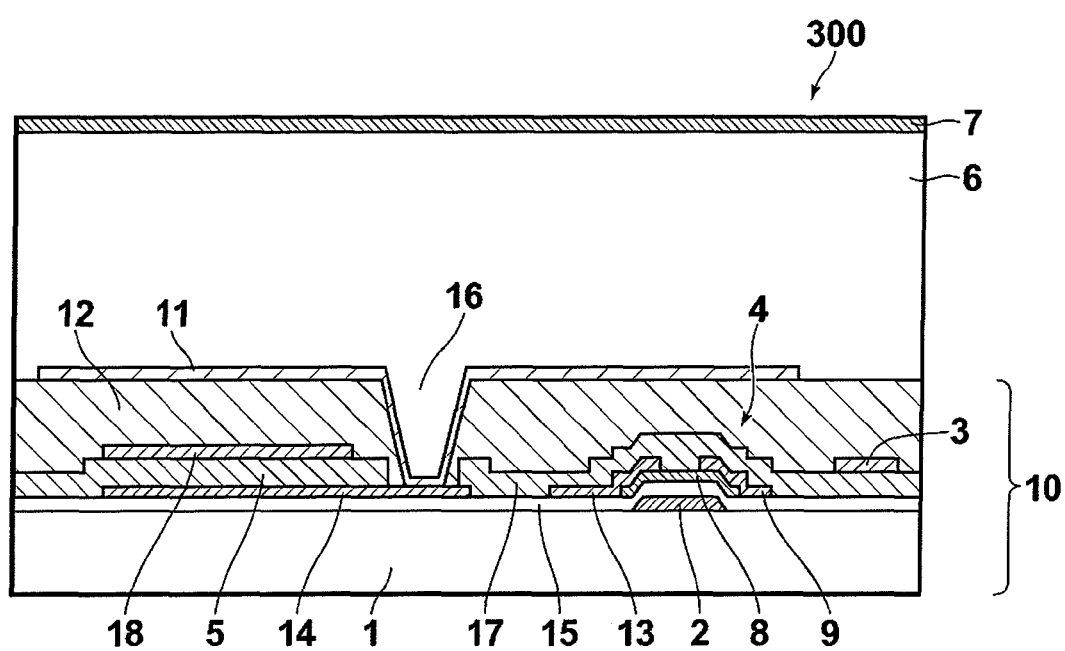
FIG. 14 is a section view showing a structure of one pixel unit of the image detector of a third exemplary embodiment of the invention.
Figure 15:
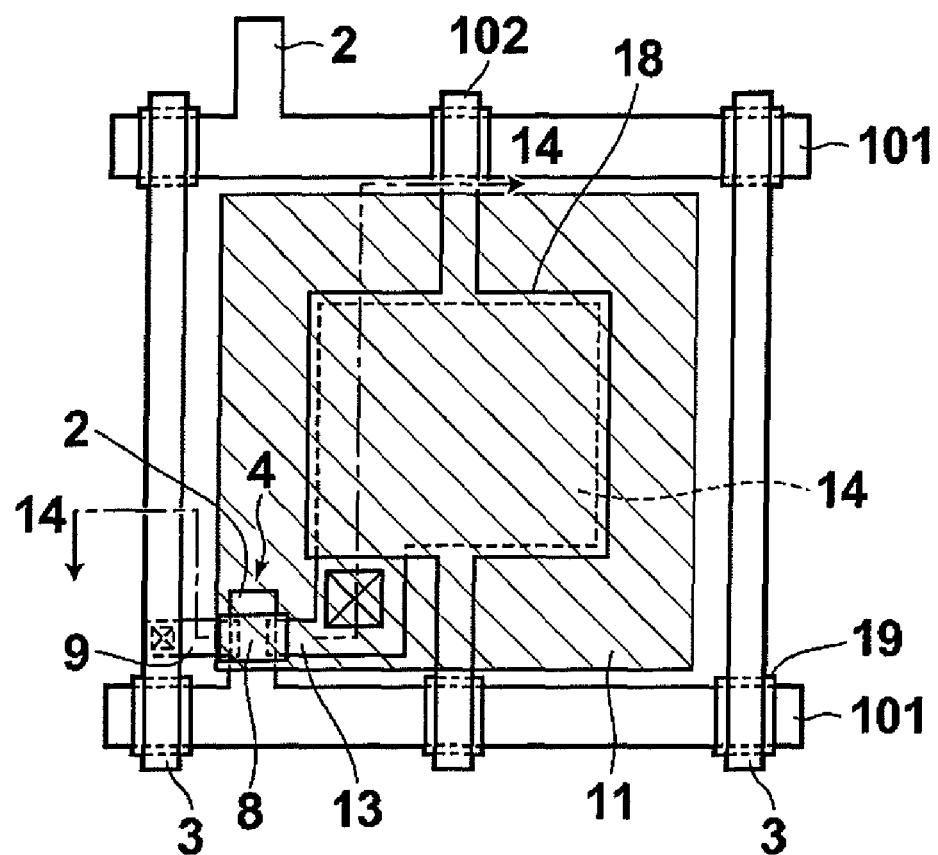
FIG. 15 is a plan view showing a structure of one pixel unit of a modified example of the radiation image detector of the third exemplary embodiment of the invention.

Next, a radiation image detector 300 of a third exemplary embodiment will be explained. FIG. 14 is a section view showing a structure of one pixel unit of the radiation image detector 300 of a third exemplary embodiment and FIG. 15 is a plan view thereof. FIG. 14 is a section view along a line 14-14 in FIG. 15.

The radiation image detector 300 of the third exemplary embodiment is different from the radiation image detector of the second exemplary embodiment in that the position of the storage capacitor line 102 is different and that the charge collecting electrode 11 is connected to the storage capacitor lower electrode 14. The other components are the same with those of the second exemplary embodiment.

The gate electrode 2 and the scan line 101 are provided on the glass substrate 1 of the radiation image detector 300 of the third exemplary embodiment. The gate insulating film 15 is provided above the gate electrode 2 and the scan line 101 and the semiconductor layer 8 is formed above the gate electrode 2 via the gate insulating film 15. The source and drain electrodes 9 and 13 are formed on the semiconductor layer 8. Then, the storage capacitor lower electrode 14 is formed in the same metal layer with the source and drain electrodes 9 and 13. Then, the insulation protecting film 17 is formed above the source electrode 9, the drain electrode 13 and the storage capacitor lower electrode 14.

The data line 3 is disposed on the insulation protecting film 17. The storage capacitor upper electrode 18 and the storage capacitor line 102 are formed in the same metal layer with the data line 3. Then, the interlayer insulating film 12 is provided above the storage capacitor upper electrode 18, the data line 3 and the storage capacitor line 102. The charge collecting electrode 11 is provided in an upper layer of the interlayer insulating film 12. The charge collecting electrode 11 is connected with the TFT switch 4 via the storage capacitor lower electrode 14 and the drain electrode 13.

The charge collecting electrode 11 is also connected with the storage capacitor lower electrode 14 by the contact hole 16 that penetrates through the interlayer insulating film 12 and the insulation protecting film 17. It is noted that the size of the contact hole 16 is desirable to be smaller than 10 μm squares. When the contact hole 16 is large, crystallization occurs by the stepped portion after forming the semiconductor film 6.

Figure 16:
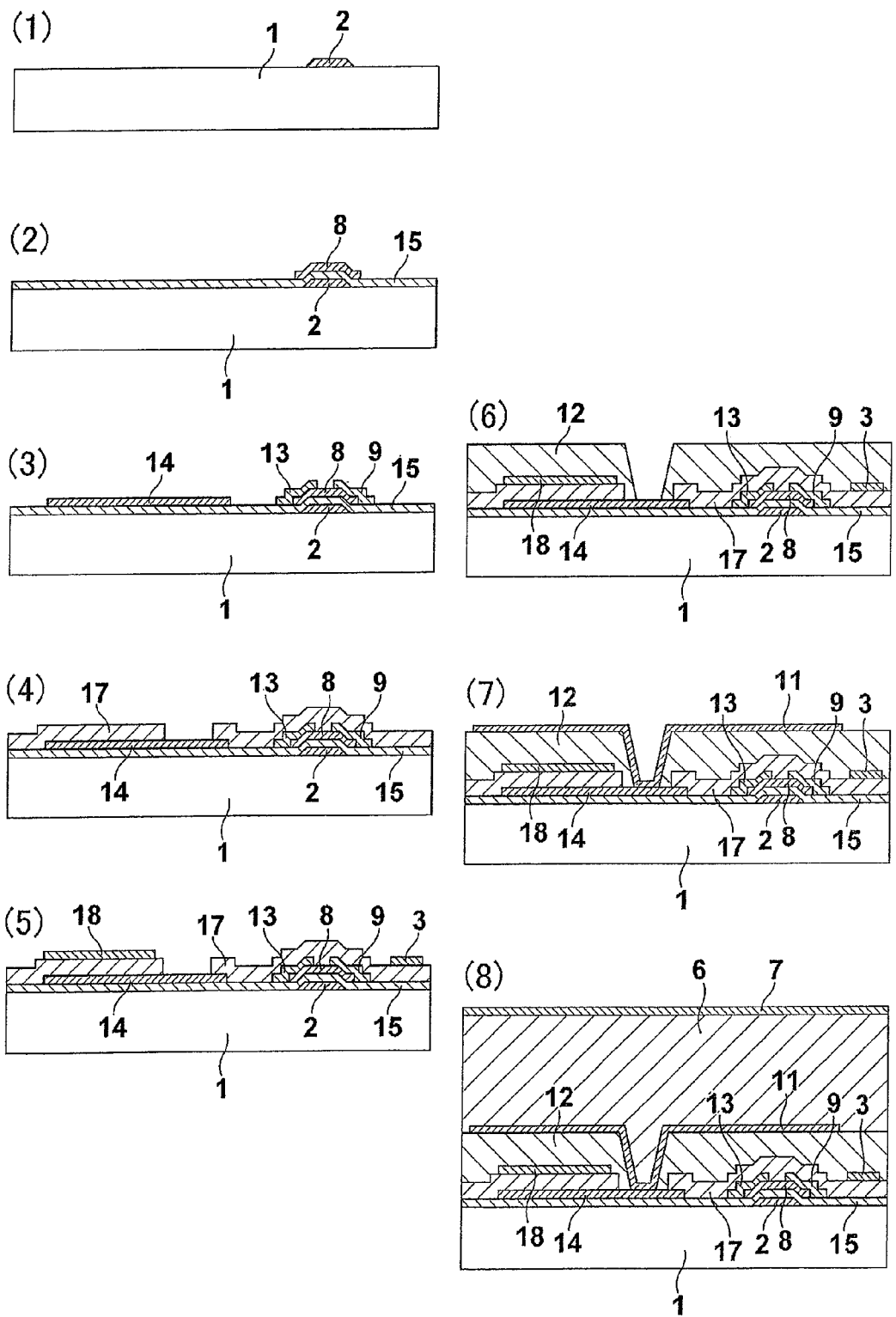
FIG. 16 is a view for explaining the steps for fabricating the radiation image detector of the third exemplary embodiment of the invention.

One exemplary manufacturing step of the radiation image detector of the third exemplary embodiment will be explained below with reference to FIG. 16. It is noted that the detail of the manufacturing step and the materials of the radiation image detector of the third exemplary embodiment are the same with the radiation image detector of the first exemplary embodiment.

The gate electrode 2 and the scan line 101 are formed as the gate line layer on the glass substrate 1 at first (1). Next, the gate insulating film 15, the semiconductor layer 8 and the impurity added semiconductor layer (not shown) are sequentially deposited on the gate line layer (2). Then, the source electrode 9, the drain electrode 13 and the storage capacitor lower electrode 14 are formed (3). Next, the insulation protecting film 17 is deposited on the layers formed as described above (4). Next, the data line 3, the storage capacitor upper electrode 18 and the storage capacitor line 102 are formed (5). Then, the interlayer insulating film 12 is deposited on the layers formed as described above (6). Then, the charge collecting electrode 11 is formed (7) and the semiconductor film 6 and the bias electrode 7 are formed thereon (8).

It is possible to obtain basically the same effect with the radiation image detector 200 of the second exemplary embodiment also in the radiation image detector 300 of the third exemplary embodiment.

In the radiation image detector of the third exemplary embodiment, the gate insulating film 15 and the insulation protecting film 17 are disposed also at the intersection of the storage capacitor line 102 with the scan line 101. Thereby, it is possible to reduce a line capacitance of the storage capacitor line 102 and the scan line 101.

Still more, the charge storage capacitor 5 is composed of two layers of the lower layer between the storage capacitor lower electrode 14 and the storage capacitor upper electrode 18, and the upper layer between the charge collecting electrode 11 and the storage capacitor upper electrode 18. Therefore, it is possible to increase the capacitance per unit area and to reduce an area of the storage capacitor upper electrode 18. A distance between the data line 3 and the storage capacitor upper electrode 18 may be widened when the area of the storage capacitor upper electrode 18 is small, so that it becomes possible to reduce the failure of leak.

Still more, because the charge storage capacitor 5 is composed of the storage capacitor lower electrode 14, the insulation protecting film 17 and the storage capacitor upper electrode 18, the charge storage capacitor 5 may be constructed by the insulating film different from the gate insulating film 15 that composes the TFT switch 4. When the charge storage capacitor 5 is composed of the gate insulating film 15 and when the gate insulating film 15 is thinned to increase the ON current of the TFT switch, the storage capacitance of the charge storage capacitor 5 also increase proportionally. In contrast, according to the radiation image detector of the second exemplary embodiment, the storage capacitance of the charge storage capacitor 5 does not increase even when the gate insulating film 15 is thinned, so that a charge transfer time of the pixel may be shortened. As a result, it becomes possible to design an ideal sensor element and to reduce the electronic noise.

It is noted that although the case when the storage capacitor line 102 for applying bias voltage commonly to the storage capacitor lower electrode 14 of each of the charge storage capacitor 5 is disposed in parallel to the data line 3 has been explained as a common line in the radiation image detectors of the second and third exemplary embodiments and the case when the scan line 101, the data line 3 and the storage capacitor line 102 are formed by the metal layers that are provided via the insulating film and that differ from each other has been explained in the radiation image detector of the second exemplary embodiment, the invention is not limited to them. For instance, when the bias electrode 7 is separately formed corresponding to each image sensor section 103 to apply bias voltage from each bias electrode 7 to the semiconductor film 6, it is possible to dispose the bias line for applying the bias voltage to each bias electrode 7 in parallel with the data line 3 and to form the bias line, the scan line 101 and the data line 3 by the metal layers that differ from each other via the insulating film.

Furthermore, although the case of applying the invention to the so-called direct conversion type radiation image detector that directly converts radiation into electric charges in the semiconductor film 6 in the radiation image detectors of the first through third exemplary embodiments, the invention is not limited to that. For instance, a bias line for applying bias voltage to an electrode of each photoelectric conversion element capacitor may be arranged in the same manner also in a so-called indirect conversion type radiation image detector that is provided with a film formed on a substrate that is made of a substance (so-called scintillator) that generates electromagnetic waves, e.g., light, when radiation collides therewith, and the indirect conversion type radiation image detector stores electric charges obtained by photoelectric conversion of light generated by the scintillator in each photoelectric conversion element with a capacitance according thereto (auxiliary capacitor is sometimes included).

Still more, the semiconductor layer 19 may be provided between the gate insulating film 15 and the insulation protecting film 17 at the intersection of the data line 3 and the scan line 101 as shown in FIG. 15 also in the radiation image detector of the third exemplary embodiment. It becomes possible to reduce the capacitance of the intersection of the data line 3 and the scan line 101 further by constructing as described above.

Figure 17:
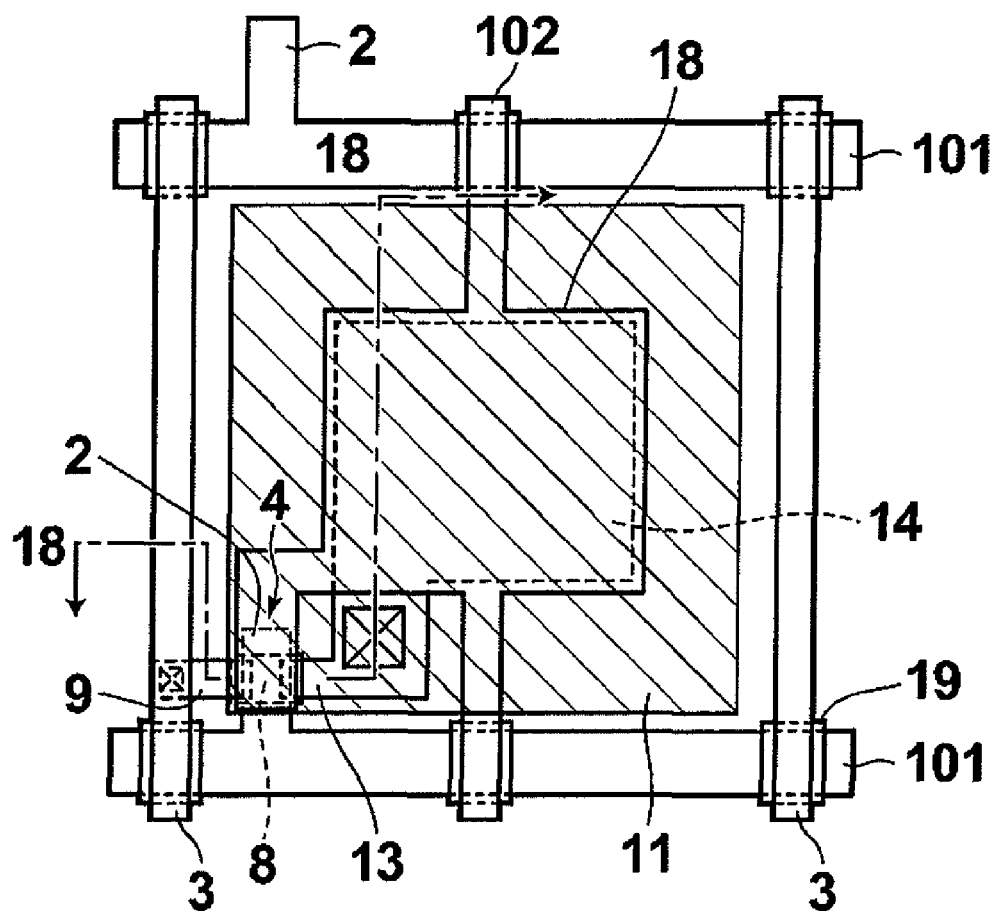
FIG. 17 is a plan view showing a structure of one pixel unit of a modified example of the radiation image detector of the third exemplary embodiment of the invention.
Figure 18:
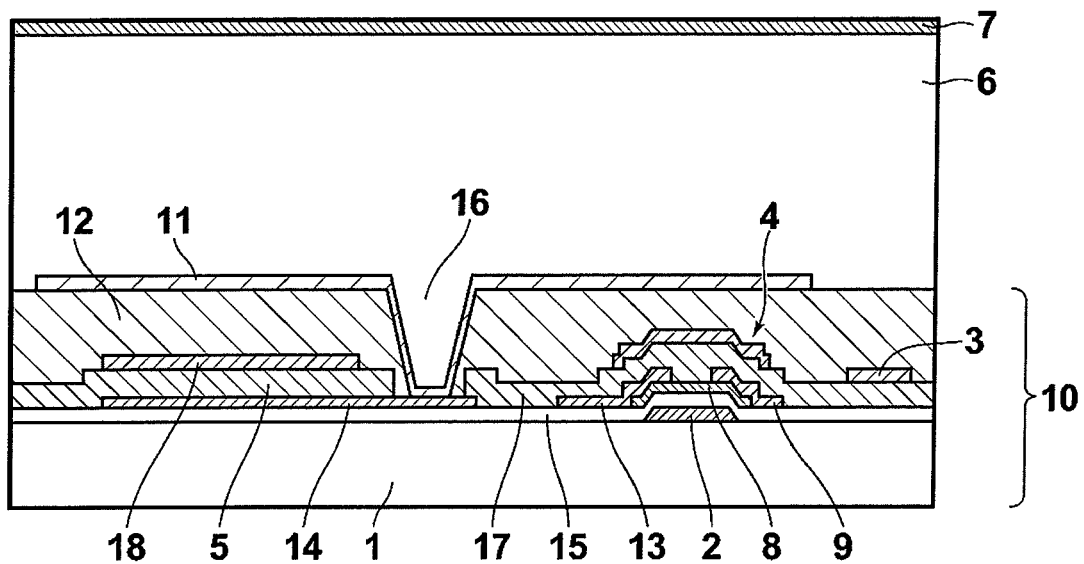
FIG. 18 is a section view showing a structure of one pixel unit of the modified example of the radiation image detector of the third exemplary embodiment of the invention.

Further, the storage capacitor upper electrode 18 may be extended so as to dispose above the TFT switch 4 via the insulation protecting film 17 as shown in FIG. 17 also in the radiation image detector of the third exemplary embodiment. FIG. 18 is a section view along a line 18-18 in FIG. 17. It becomes possible to realize a shield structure to the potential of the charge collecting electrode 11 by constructing as described above. For instance, even if 100 V is applied to the charge collecting electrode 11, no electric field is applied to the back channel of the TFT switch 4 if a potential of the data line 3 is 0 V.

Still more, it is desirable to thicken the thickness of the insulation protecting film 17 more than that of the gate insulating film 15 in the radiation image detector of the first through third exemplary embodiments. Table 1 shows the materials of the gate insulating film 15 and the insulation protecting film 17 and an appropriate range, a more preferable range and an ideal value of the thickness and dielectric constant of the gate insulating film 15 and the insulation protecting film 17. It is desirable to thin the gate insulating film 15 to enhance the driving capability of the TFT switch 4 and to thicken the insulation protecting film 17 to reduce the line capacitance of the data line.

TABLE 1

| | | Appropriate Range | More Preferable Range | Ideal Value |
| --- | --- | --- | --- | --- |
| Gate Insulating Film | Material | SiNx | SiNx | SiNx |
| | Thickness (nm) | 100 to 600 | 200 to 400 | 300 |
| | $\epsilon r$ | 6 to 8 | 6 to 8 | 7 |
| Insulating Protection Film | Material | SiNx | SiNx | SiNx |
| | Thickness (nm) | 200 to 800 | 400 to 600 | 500 |
| | $\epsilon r$ | 6 to 8 | 6 to 8 | 7 |

Still more, the dielectric constant of the insulation protecting film 17 is desirable to be lower than the dielectric constant of the gate insulating film 15 in the radiation image detector of the first through third exemplary embodiments. Table 2 shows the materials of the gate insulating film 15 and the insulation protecting film 17 and an appropriate range, a more preferable range and an ideal value of the thickness and dielectric constant of the gate insulating film 15 and the insulation protecting film 17.

TABLE 2

|  |  | Appropriate Range | More Preferable Range | Ideal Value |
|---|---|---|---|---|
| Gate Insulating Film | Material | SiNx | SiNx | SiNx |
|  | Thickness (nm) | 100 to 600 | 200 to 400 | 300 |
|  | εr | 6 to 8 | 6.5 to 7.5 | 7 |
| Insulating Protection Film | Material | SiOx, SOG, SiC, SiCN | SiOx, SOG, SiC, SiCN | SiOx |
|  | Thickness (nm) | 100 to 600 | 200 to 400 | 300 |
|  | εr | 2 to 5 | 3 to 4 | 3.0 to 3.5 |

The radiation image detector of the first through third exemplary embodiments is used for an X-ray image detective device for forming an image of the X-rays that has transmitted through a human body for example and is an image sensor capable of detecting an image of the X-rays and others.

Figure 19:
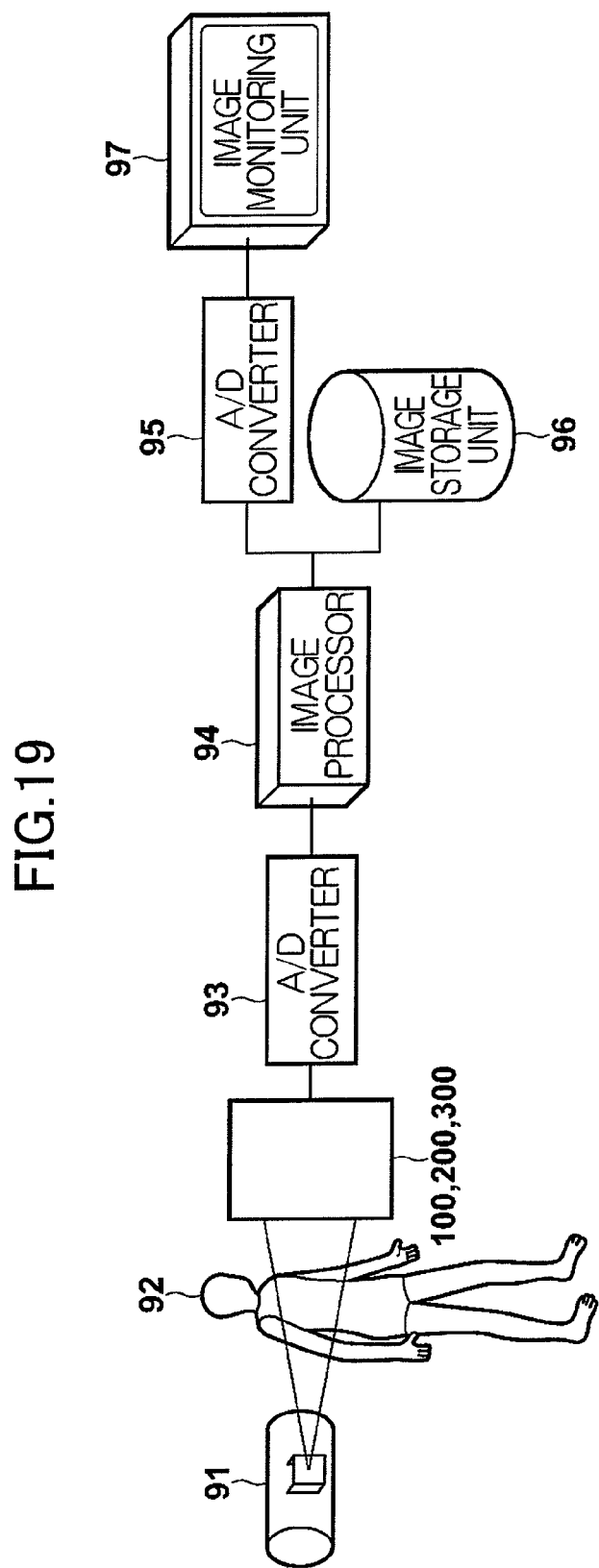
FIG. 19 is a schematic block diagram of a radiation detecting system of the invention.
Figure 20:
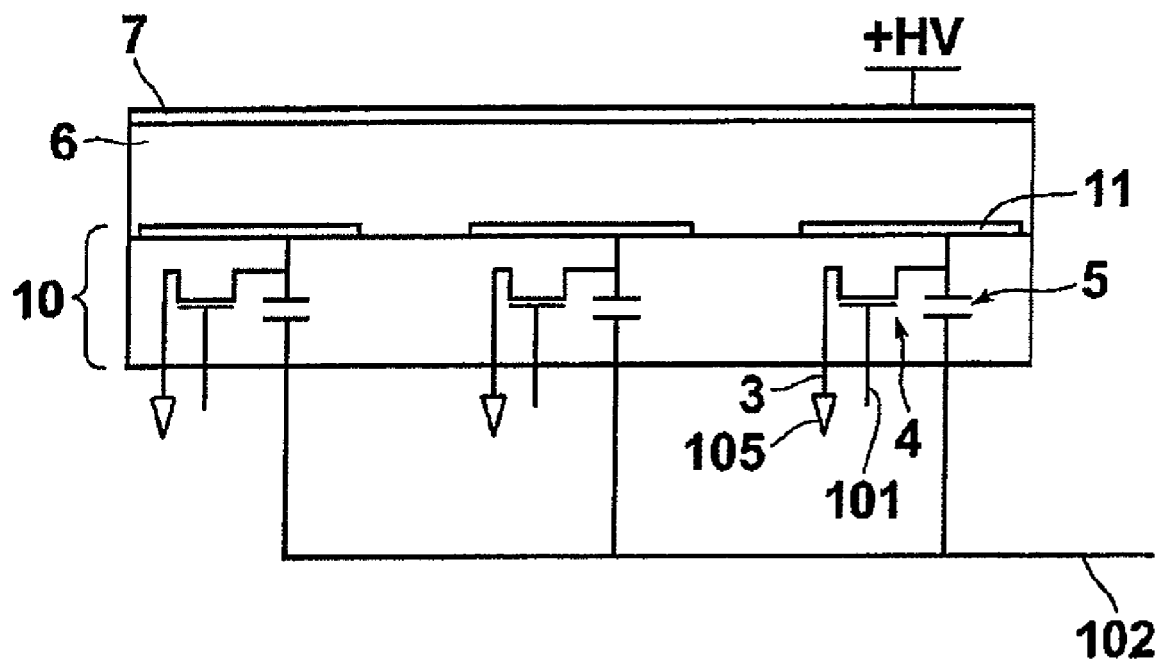
FIG. 20 is a schematic circuit diagram of a conventional art radiation image detector.
Figure 21:
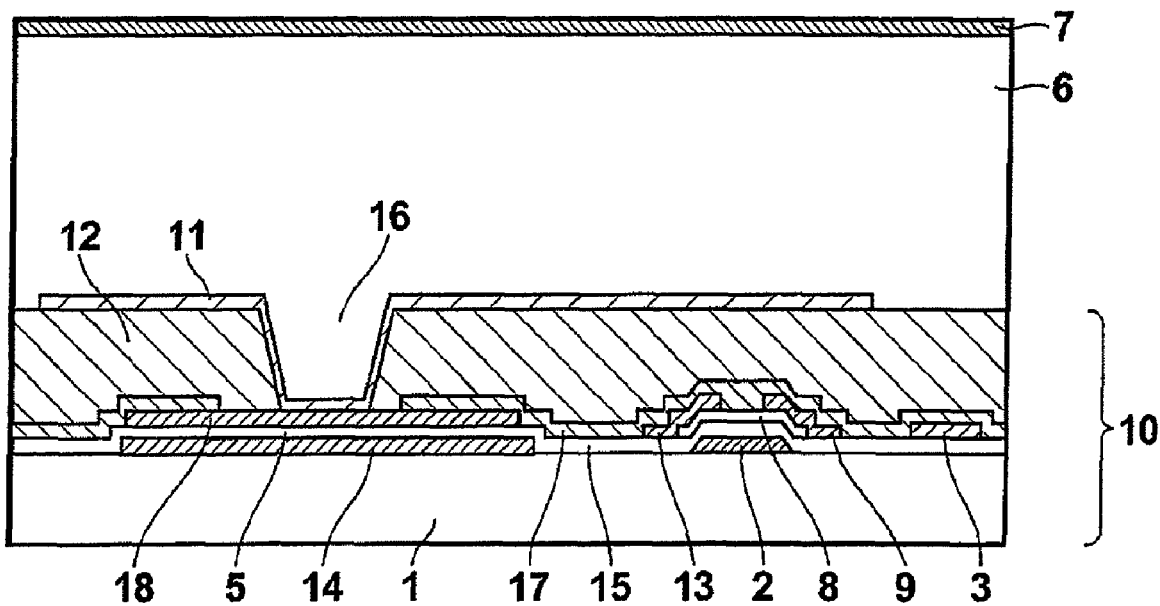
FIG. 21 is a section view showing a structure of one pixel unit of a conventional art radiation image detector.
Figure 22:
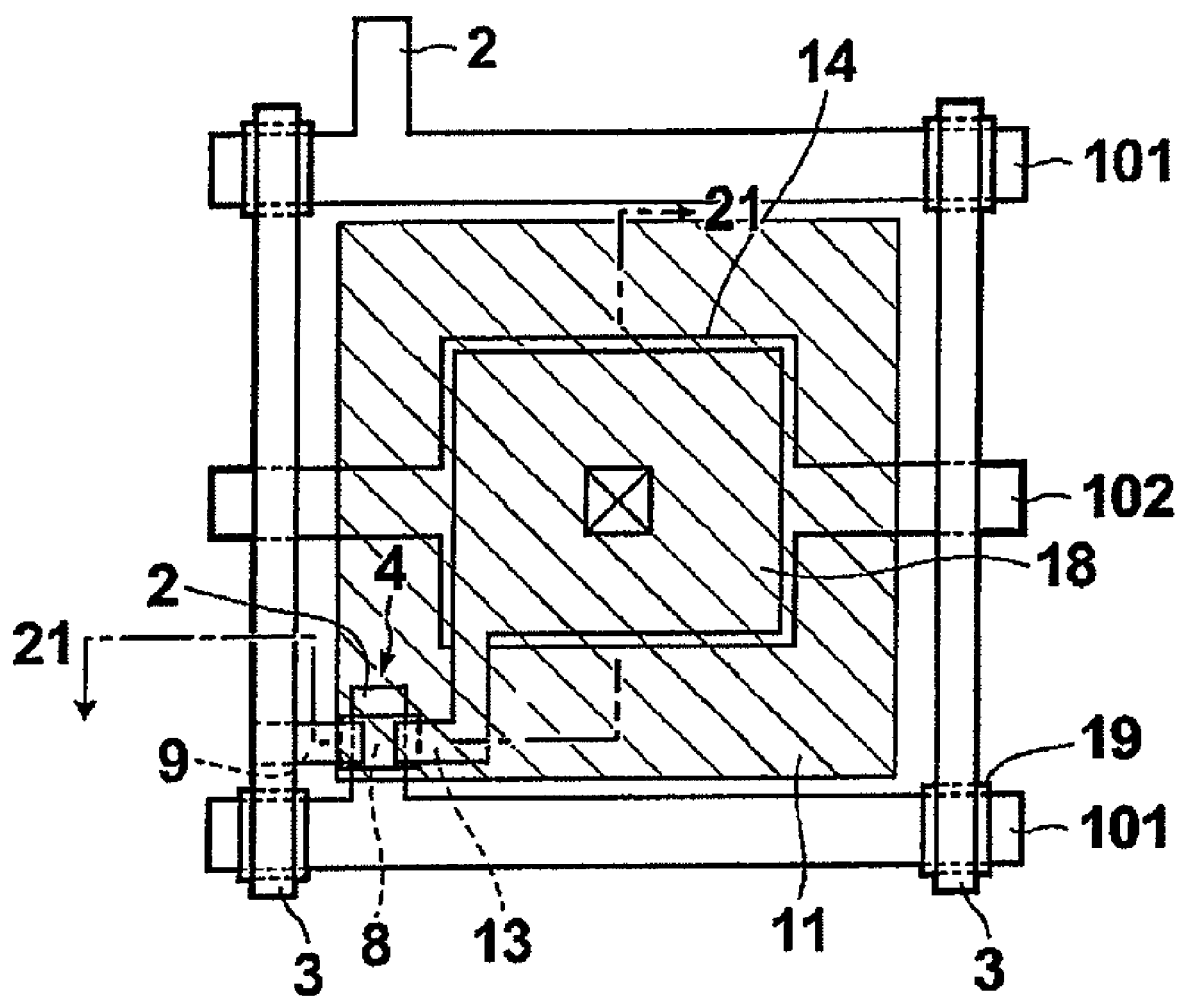
FIG. 22 is a plan view showing a structure of one pixel unit of the conventional art radiation image detector.

That is, a transmitted X-ray image of a specimen 92 formed by the X-rays outputted out of an X-ray tube 91 is converted into image signals by the radiation image detector 100, 200 or 300 of the exemplary embodiments as shown in FIG. 19 for example.

An analog signal outputted out of the radiation image detector 100, 200 or 300 is converted into a digital image signal by an A/D converter 93 and is taken into an image processor 94. The image processor 94 implements various image processing and stores images necessary to be kept in an image storage device 96. The digital image signal outputted out of the image processor 94 is converted into an analog signal by a D/A converter 95 so as to be displayed on a screen of an image monitor 97.

Furthermore, in the radiation image detector of the first through third exemplary embodiment, the semiconductor film 6 may be made of a-Se, one in which a small amount from 0.001 ppm to 20 ppm of alkali metals such as Li, Na, K, Cs, Rb is doped to a-Se, one in which a small amount from 10 ppm to 10000 ppm of fluorides such as LiF, NaF, KF, CsF, RbF and others is doped to a-Se, one in which 50 ppm to 0.5% of P, As, Sb or Ge is added to a-Se or one in which 50 ppm to 0.5% of As is added and a small amount from 1 ppm to 100 ppm of Cl, Br or I is doped to a-Se. Furthermore, one in which a photo-conductive material whose main component is at least one among $Bi_2MO_2O$(M: Ti, Si, Ge), $Bi_4M_3O_{12}$(M: Ti, Si, Ge), $Bi_2O_3$, $BiMO_4$(M: Nb, Ta, V), $Bi_2WO_6$, $Bi_{24}B_2O_{39}$, ZnO, ZnS, ZnTe, $MNbO_3$(M: Li, Na, K), PbO, $HgI_2$, $PbI_2$, CdS, CdSe, CdTe, $BiI_3$, GaAs and others is contained in a-Se may be utilized.

When the semiconductor film 6 generates electric charges by directly receiving the X-rays, a preferable range of its thickness is 100 μm to 2 mm.

The preferable range is 150 to 250 μm for the use of mammography and is 500 μm to 1.5 mm for the use of general radiography for medical diagnoses.

Furthermore, bismuth complex oxide may be used as the semiconductor film 6. This is described in Japanese Patent Application Laid-open No. 2005-274257 for example.

When an amorphous semiconductor with a-Se as a principal component thereof is used as the semiconductor film 6, in order to prevent crystallization thereof, it is also possible to provide an upper electrode interfacial layer between the semiconductor film 6 and the bias electrode 7 and a lower electrode interfacial layer between the semiconductor film 6 and the charge collecting electrode 11, to prevent such crystallization. As the electrode interfacial layers described above, one in which As is doped in a range of 1% to 20% to a-Se, one in which S, Te, P, Sb and Ge is doped in a range from 1% to 10% to a-Se, one in which a combination of the elements described above with other elements is doped to a-Se or the like may be used. Or, $As_2S_3$ and $As_2Se_3$ whose crystallization temperature is high may be used.

It is also possible to dope alkali metal such as Li, Na, K, Rb, Cs or molecules of LiF, NaF, KF, RbF, CsF, LiCl, NaCl, KCl, RbCl, CsCl, CsBr and the like in a range of 10 ppm to 5000 ppm for the purpose of preventing injection of electric charges from the bias electrode 7 or the charge collecting electrode 11 and more specifically for the purpose of preventing injection of positive holes in addition to the doped elements described above. Conversely, halogen elements such as Cl, I, Br and the like or molecules such as $In_2O_3$ may be doped in a range of 10 ppm to 5000 ppm to prevent injection of electrons. The thickness of the upper and lower electrode interfacial layers may be also set from 0.05 μm to 1 μm in order to fully achieve the aforementioned objects.

The lower electrode interfacial layer, the semiconductor film and the upper electrode interfacial layer are deposited on the substrate by keeping the substrate at temperature between normal temperature to 70° C. within a vacuum chamber whose degree of vacuum is $10^{-3}$ to $10^{-7}$ Torr and by raising temperature of a boat or a pot containing each alloy described above by resistance heating or electron beams to evaporate or sublimate the alloy or compounds.

When evaporation temperature of the ingredients of the alloy largely differs from each other, it is possible to control adding and doping densities by individually controlling them by simultaneously heating plural boats corresponding to plural evaporation sources. For instance, it is possible to realize a layered structure of a-Se (As 10%: LiF 500 ppm)/a-Se/a-Se (As 10%) by putting As2Se3, a-Se and LiF into the boats, respectively, and by opening/closing a shutter of each boat by setting the temperature of the boat of As2Se3 at 340° C., of the boat of a-Se at 240° C. and of the boat of LiF at 800° C.

The bias electrode 7 is a metal thin film and may be made of metal such as Au, Ni, Cr, Pt, Ti, Al, Cu, Pd, Ag, Mg, MgAg 3 to 20% alloy, Mg—Ag intermetallic compound, MgCu 3 to 20% alloy and Mg—Cu intermetallic compound. When Au is used for example, its thickness is desirable to be around 15 nm to 200 nm. When MgAg 3 to 20% alloy is used for example, the thickness is desirable to be around 100 nm to 400 nm.

The bias electrode 7 is formed on the upper surface of the semiconductor film 6 by means of vapor deposition. The bias electrode 7 is formed by opening the shutter after melting a metal block within the boat by heating by a resistance heating method, by depositing for 15 seconds, by cooling once and by repeating this process by a plural times until when a resistance value becomes fully low.

It is noted that although the radiation image detector of the first through third exemplary embodiments has been a so-called direct conversion type radiation image detector that generates electric charges by directly receiving the radiation, the image detector of the invention is not limited to the direct-conversion type radiation image detector but is also applicable to a so-called indirect conversion type radiation image detector that converts radiation once into light by a phosphor and that generates electric charges by receiving the light.

In an indirect conversion type radiation image detector, if a layer from fluorescent bodies is formed on the semiconductor film 6, X-rays are at first absorbed in the fluorescent bodies, and charges may be generated by the semiconductor film 6 by receiving the light generated by the fluorescent bodies by the X-rays being absorbed, and the semiconductor film 6 may be made of the order of 1 μm to 20 μm thick. By so doing, since the electrostatic capacitance of the charge collecting electrode 11 becomes large, it is often unnecessary to provide a separate charge storage capacitor 5 as is done in a direct conversion type radiation image detector.

In an indirect conversion type radiation image detector the semiconductor film 6 may be formed continuously as with in a direct conversion type radiation image detector, however, a photodetection element array is often used in which the semiconductor film 6 is divided up into individual pixels. In such a case, the bias electrode 7 is connected by common lines.

In an indirect conversion type radiation image detector, since there is no need to use a material with a large X-ray absorption ability for the semiconductor film 6, amorphous silicon (a-Si) and organic compounds, which have been constructed in layers of a charge generating layer and a charge transporting layer, may be used. For example, the semiconductor film 6 may be built up on TFT switches 4 by continuously forming the semiconductor film 6 using a vapor phase epitaxy, spin coating, or dip coating method. Organic materials that may be used for the charge generating layer include materials such as benzimidazole perylene, hydroxygallium phthalocyanine, titanyl phthalocyanine, and organic materials that may be used for the charge transporting layer include materials such as tetraphenyldiamine.

Furthermore, since it is necessary in an indirect conversion type radiation image detector for the light that are generated from the fluorescent bodies that have absorbed the X-rays to pass through the bias electrode 7, electrodes that are able to transmit light, such as ITO or IZO, may be used for the bias electrode 7.

What is claimed is:

1. An image detector, comprising:
a plurality of scan lines disposed in parallel;
a plurality of data lines provided so as to cross with the scan lines, the plurality of data lines being formed in a metal layer that is different from a metal layer in which the scan lines are formed, with an insulating film formed between the two metal layers;
thin film transistors connected with the scan lines and data lines and provided in a matrix;
sensor sections comprising a semiconductor film that generates charges when irradiated with electromagnetic radiation, the sensor sections being connected to the thin film transistors and provided in a matrix; and
a plurality of common lines disposed so as to commonly apply bias voltage to the sensor sections provided in a matrix, the plurality of common lines being formed in a first metal layer that is below the semiconductor film of the sensor sections and is a different metal layer from a second metal layer in which the scan lines are formed, and is a different metal layer from a third metal layer in which the data lines are formed, and there being insulating film formed between adjacent first, second and third metal layers, wherein the first, second and third metal layers are formed at different levels in a vertical structure.

2. The image detector according to claim 1, wherein the common lines are disposed in parallel with the data lines.

3. The image detector according to claim 1, wherein the common lines are formed in a metal layer in which source and drain electrodes of the thin film transistors are formed.

4. The image detector according to claim 1, wherein each of the sensor sections further comprises a storage capacitor for storing respective electric charges generated in the semiconductor film when electromagnetic waves are irradiated; and
the common lines are connected to the storage capacitor.

5. The image detector according to claim 4, further comprising, disposed in this sequence:

a substrate;
a first metal layer that forms the scan lines and the gate electrodes of the thin film transistors;
one or more first insulating film(s);
a second metal layer that forms the source and drain electrodes of the thin film transistors, the storage capacitors lower electrodes and the common lines;
one or more second insulating film(s);
a third metal layer that forms the data lines and the storage capacitors upper electrodes;
one or more third insulating film(s);
a fourth metal layer that forms charge collecting electrodes for collecting the electric charges to the storage capacitors;
a semiconductor film that generates the electric charges when it is irradiated by electromagnetic waves; and
a bias electrode that applies bias voltage to the semiconductor film.

6. The image detector according to claim 5, wherein the first insulating film(s), the semiconductor film and the second insulating film(s) are layered between the data lines and the scan lines.

7. The image detector according to claim 5, wherein the storage capacitors upper electrodes are disposed above the thin film transistors with the second insulating film(s) therebetween.

8. The image detector according to claim 5, wherein the data lines extend to an upper part of the thin film transistors.

9. The image detector according to claim 5, wherein a thickness of the second insulating film(s) is thicker than that of the first insulating film(s).

10. The image detector according to claim 5, wherein a dielectric constant of the second insulating film(s) is lower than that of the first insulating film(s).

11. The image detector according to claim 1, wherein each of the sensor sections further comprises a bias electrode that applies bias voltage to the semiconductor film; and
the common lines are connected to the bias electrodes.

12. The image detector according to claim 1, wherein the data lines are disposed on the insulating film provided on the metal layer in which the source and drain electrodes of the thin film transistor are formed.

13. A radiation detecting system, comprising:
the image detector of claim 1;
a signal processing section for processing signals that have been outputted from the image detector;
a storage section for storing the processed signals that have been outputted from the signal processing section;
a display section for displaying images based on the processed signal that have been outputted from the signal processing section; and
a radiation source for outputting radiation toward the image detector.

14. An image detector, comprising, disposed in this sequence:
a substrate;
a first metal layer forming
a plurality of scan lines disposed in parallel, and
gate electrodes for thin film transistors provided in a matrix;
one or more first insulating film(s);
a second metal layer, forming source electrodes and drain electrodes of the thin film transistors and forming storage capacitor lower electrodes that store charges that have been generated by irradiated electromagnetic waves;
one or more second insulating film(s);

a third metal layer, forming
- data lines provided so as to cross with the scan lines,
- storage capacitor upper electrodes, and
- a plurality of common lines provided parallel to the data lines, for applying bias voltage to the storage capacitor lower electrodes;

one or more third insulating film(s);

a fourth metal layer, forming charge collecting electrodes that accumulate the charges to the storage capacitors;

a semiconductor film that generates the electric charges when irradiated with electromagnetic waves; and a bias electrode, applying bias voltage to the semiconductor film.

* * * * *